(12) United States Patent
Kato et al.

(10) Patent No.: US 10,134,562 B2
(45) Date of Patent: Nov. 20, 2018

(54) MULTI CHARGED PARTICLE BEAM WRITING APPARATUS, AND MULTI CHARGED PARTICLE BEAM WRITING METHOD

(71) Applicant: NuFlare Technology, Inc., Yokohama-shi (JP)

(72) Inventors: Yasuo Kato, Yokohama (JP); Hideo Inoue, Miura-gun (JP); Hiroshi Matsumoto, Yokohama (JP); Ryoh Kawana, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 131 days.

(21) Appl. No.: 14/969,478

(22) Filed: Dec. 15, 2015

(65) Prior Publication Data

US 2016/0181062 A1 Jun. 23, 2016

(30) Foreign Application Priority Data

Dec. 22, 2014 (JP) .................................. 2014-259469

(51) Int. Cl.
*G01D 18/00* (2006.01)
*H01J 37/24* (2006.01)
(Continued)

(52) U.S. Cl.
CPC .......... *H01J 37/243* (2013.01); *H01J 37/304* (2013.01); *H01J 37/3177* (2013.01); *H01J 2237/30433* (2013.01); *H01J 2237/31761* (2013.01)

(58) Field of Classification Search
CPC . H04N 5/33; G01J 5/522; A61B 6/583; G01T 1/40; G01D 18/00
See application file for complete search history.

(56) References Cited

U.S. PATENT DOCUMENTS 8,710,467 B2 4/2014 Yoshikawa et al.
8,729,507 B2 5/2014 Yoshikawa et al.
(Continued)

FOREIGN PATENT DOCUMENTS

JP 2012-59984 A 3/2012
JP 2013-55144 3/2013
(Continued)

OTHER PUBLICATIONS

U.S. Appl. No. 14/944,640, filed Nov. 18, 2015, Ryoh Kawana et al.
(Continued)

*Primary Examiner* — Edwin Gunberg
*Assistant Examiner* — Mamadou Faye
(74) *Attorney, Agent, or Firm* — Oblon, McClelland, Maier & Neustadt, L.L.P.

(57) ABSTRACT

A multi charged particle beam writing apparatus includes a modulation rate data calculation processing circuitry to calculate, for each pixel being a unit region, a modulation rate of a beam to a pixel concerned and each modulation rate of a beam to at least one pixel at a periphery of the pixel concerned, and a corrected-dose calculation processing circuitry to calculate, for the each pixel, a corrected dose by adding a multiplied value obtained by multiplying the modulation rate of the pixel concerned in a modulation rate map by beam dose to the pixel concerned, and a multiplied value obtained by multiplying the modulation rate of the pixel concerned which becomes one of the at least one pixel at the periphery with respect to another pixel defined for the position of the pixel concerned by a beam dose to the another pixel.

12 Claims, 15 Drawing Sheets

(51) Int. Cl.
*H01J 37/304* (2006.01)
*H01J 37/317* (2006.01)

(56) References Cited

U.S. PATENT DOCUMENTS

| | | |
|---|---|---|
| 8,907,306 B2 | 12/2014 | Yoshikawa et al. |
| 2012/0295202 A1* | 11/2012 | Sano .................. H01J 37/3007 430/296 |
| 2013/0056647 A1 | 3/2013 | Yoshikawa et al. |
| 2013/0320230 A1* | 12/2013 | Yoshikawa ......... H01J 37/3177 250/398 |
| 2014/0187056 A1 | 7/2014 | Yoshikawa et al. |
| 2014/0229904 A1* | 8/2014 | Fujimura .................. G03F 1/20 716/54 |
| 2015/0064934 A1 | 3/2015 | Yoshikawa et al. |
| 2016/0155610 A1 | 6/2016 | Kawana et al. |

FOREIGN PATENT DOCUMENTS

| | | |
|---|---|---|
| JP | 2014-7379 | 1/2014 |
| JP | 2016-103557 A | 6/2016 |
| KR | 10-2013-0135772 | 12/2013 |
| TW | 201411686 A | 3/2014 |

OTHER PUBLICATIONS

Office Action dated Sep. 6, 2016 in the corresponding Korean Patent Application No. 10-2015-0183651 (with English Translation).
Combined Taiwanese Office Action and Search Report dated Dec. 6, 2016 in Patent Application No. 104138122 (with English translation).
Office Action dated Feb. 17, 2017 in Korean Patent Application No. 10-2015-0183651 (with English translation).
Japanese Office Action dated Sep. 25, 2018, issued in Japanese Application No. 2014-259469 (with English translation).

* cited by examiner

No Correction Performed (Focusing on One Mesh)

| 0.0 | 0.0 | 0.0 | 0.0 | 0.0 | 0.0 |
|---|---|---|---|---|---|
| 0.0 | 0.0 | 0.0 | 0.0 | 0.0 | 0.0 |
| 0.0 | 0.0 | 1.0 | 0.0 | 0.0 | 0.0 |
| 0.0 | 0.0 | 0.0 | 0.0 | 0.0 | 0.0 |
| 0.0 | 0.0 | 0.0 | 0.0 | 0.0 | 0.0 |
| 0.0 | 0.0 | 0.0 | 0.0 | 0.0 | 0.0 |

FIG. 7A

| 0.0 | 0.0 | 0.0 | 0.0 | 0.0 | 0.0 |
|---|---|---|---|---|---|
| 0.0 | 0.0 | 0.0 | 0.0 | 0.0 | 0.0 |
| 0.0 | 0.0 | 0.0 | 0.0 | 0.0 | 0.0 |
| 0.0 | 0.0 | 1.0 | 0.0 | 0.0 | 0.0 |
| 0.0 | 0.0 | 0.0 | 0.0 | 0.0 | 0.0 |
| 0.0 | 0.0 | 0.0 | 0.0 | 0.0 | 0.0 |

FIG. 7B

Correction Performed (Focusing on One Mesh)

| 0.0 | 0.0 | 0.0 | 0.0 | 0.0 | 0.0 |
|---|---|---|---|---|---|
| 0.0 | 0.0 | 0.0 | 0.0 | 0.0 | 0.0 |
| 0.0 | 0.15 | 0.64 | 0.0 | 0.0 | 0.0 |
| 0.0 | 0.07 | 0.14 | 0.0 | 0.0 | 0.0 |
| 0.0 | 0.0 | 0.0 | 0.0 | 0.0 | 0.0 |
| 0.0 | 0.0 | 0.0 | 0.0 | 0.0 | 0.0 |

FIG. 8A

| 0.0 | 0.0 | 0.0 | 0.0 | 0.0 | 0.0 |
|---|---|---|---|---|---|
| 0.0 | 0.0 | 0.0 | 0.0 | 0.0 | 0.0 |
| 0.0 | 0.0 | 0.0 | 0.0 | 0.0 | 0.0 |
| 0.0 | 0.08 | 0.73 | 0.0 | 0.0 | 0.0 |
| 0.0 | 0.05 | 0.14 | 0.0 | 0.0 | 0.0 |
| 0.0 | 0.0 | 0.0 | 0.0 | 0.0 | 0.0 |

FIG. 8B

|  |  |  |  |  |  |
|---|---|---|---|---|---|
|  |  |  |  |  |  |
|  |  |  |  |  |  |
|  | →0.15 | *0.64 |  |  |  |
|  | ↗ 0.07<br>→0.08 | ↑ 0.14<br>* 0.73 |  |  |  |
|  | ↗ 0.05 | ↑ 0.14 |  |  |  |
|  |  |  |  |  |  |

FIG. 9

| 0.0 | 0.0 | 0.0 | 0.0 | 0.0 | 0.0 |
|---|---|---|---|---|---|
| 0.0 | 0.0 | 0.0 | 0.0 | 0.0 | 0.0 |
| 0.0 | 0.12 | 0.512 | 0.0 | 0.0 | 0.0 |
| 0.0 | 0.08 | 0.331 | 0.0 | 0.0 | 0.0 |
| 0.0 | 0.015 | 0.042 | 0.0 | 0.0 | 0.0 |
| 0.0 | 0.0 | 0.0 | 0.0 | 0.0 | 0.0 |

MULTI CHARGED PARTICLE BEAM WRITING APPARATUS, AND MULTI CHARGED PARTICLE BEAM WRITING METHOD

CROSS-REFERENCE TO RELATED APPLICATION

This application is based upon and claims the benefit of priority from the prior Japanese Patent Application No. 2014-259469 filed on Dec. 22, 2014 in Japan, the entire contents of which are incorporated herein by reference.

BACKGROUND OF THE INVENTION

Field of the Invention

Embodiments of the present invention relate generally to a multi charged particle beam writing apparatus and a multi charged particle beam writing method, and more specifically, to a method of correcting pattern position deviation and pattern dimension deviation, due to positional deviation of a beam in multi-beam writing, by modulating a dose, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits progressively narrows year by year. An electron beam writing technique intrinsically having high resolution is used for writing or "drawing" a mask pattern on a mask blank with electron beams.

As an example employing the electron beam writing technique, a writing apparatus using multi-beams can be cited. Compared with the case of writing a pattern with a single electron beam, since in multi-beam writing it is possible to irradiate multiple beams at a time, the throughput can be greatly increased. For example, in a writing apparatus employing a multi-beam system, multi-beams are formed by letting portions of an electron beam emitted from an electron gun pass through a corresponding hole of a plurality of holes in the mask, blanking control is performed for each beam, each unblocked beam is diminished by an optical system to reduce a mask image and deflected by a deflector so as to irradiate a desired position on a target object or "sample".

In multi-beam writing, positional deviation of beams occurs due to distortion of the optical system, deviation from the design values of the aperture array for forming multi-beams, and/or the Coulomb effect, etc. There is a problem in that, if positional deviation occurs in a beam of multi-beams, positional deviation and dimension deviation also occur in a written pattern. Therefore, it is desirable to correct the positional deviation and dimension deviation of a pattern which is formed by irradiation of a beam with positional deviation. For example, it is proposed to calculate, with respect to positional deviation due to optical distortion, a shot position including the amount of the distortion, and to adjust the dose of a beam to irradiate the shot position, depending on the area density of a pattern located in the region configured on the premise of the shot position including the amount of the distortion (e.g., refer to Japanese Patent Application Laid-open (JP-A) No. 2014-007379).

However, conventionally, a method sufficiently effective for correcting positional deviation and dimension deviation of a pattern which is formed by irradiation of a beam with positional deviation has not been established yet.

BRIEF SUMMARY OF THE INVENTION

According to one aspect of the present invention, a multi charged particle beam writing apparatus includes a modulation rate data calculation processing circuitry configured to calculate, for each pixel being a unit region for irradiation per beam of multi charged particle beams, a modulation rate of a beam to a pixel concerned and each modulation rate of a beam to at least one pixel at a periphery of the pixel concerned for correcting positional deviation and dimension deviation of a pattern formed by a beam with positional deviation to irradiate the pixel concerned by modulating a beam dose to the pixel concerned and each beam dose to the at least one pixel at the periphery of the pixel concerned, a modulation rate map generation processing circuitry configured to generate a modulation rate map which defines a modulation rate for a writing region to be written by the multi charged particle beams such that a calculated modulation rate of the beam to the pixel concerned is defined for a position of the pixel concerned and each calculated modulation rate of the beam to the at least one pixel at the periphery of the pixel concerned is defined for a position of a corresponding pixel of the at least one pixel at the periphery of the pixel concerned in such a manner to be related to the pixel concerned for the each pixel, a dose calculation processing circuitry configured to calculate, for the each pixel, the beam dose to the pixel concerned, a corrected-dose calculation processing circuitry configured to calculate, for the each pixel, a corrected dose by adding a multiplied value obtained by multiplying the modulation rate of the beam to the pixel concerned defined in the modulation rate map by the beam dose to the pixel concerned, and a multiplied value obtained by multiplying the modulation rate of the beam to the pixel concerned which becomes one of the at least one pixel at the periphery with respect to another pixel defined for the position of the pixel concerned in the modulation rate map by a beam dose to the another pixel, and a writing mechanism included a stage on which a target object is placed, a charged particle beam source, and a deflector, and configured to write a pattern on the target object with the multi charged particle beams such that each beam of the corrected dose irradiates a corresponding pixel.

According to another aspect of the present invention, a multi charged particle beam writing method includes calculating, for each pixel being a unit region for irradiation per beam of multi charged particle beams, a modulation rate of a beam to a pixel concerned and each modulation rate of a beam to at least one pixel at a periphery of the pixel concerned for correcting positional deviation and dimension deviation of a pattern formed by a beam with positional deviation to irradiate the pixel concerned by modulating a beam dose to the pixel concerned and each beam dose to the at least one pixel at the periphery of the pixel concerned, generating, for the each pixel, a modulation rate map which defines a modulation rate for a writing region to be written by the multi charged particle beams such that a calculated modulation rate of the beam to the pixel concerned is defined for a position of the pixel concerned and each calculated modulation rate of the beam to the at least one pixel at the periphery of the pixel concerned is defined for a position of a corresponding pixel of the at least one pixel at the periphery of the pixel concerned in such a manner to be related to the pixel concerned, calculating, for the each pixel, the beam dose to the pixel concerned, calculating, for the each pixel, a corrected dose by adding a multiplied value obtained by multiplying the modulation rate of the beam to the pixel concerned defined in the modulation rate map by the beam dose to the pixel concerned, and a multiplied value obtained by multiplying the modulation rate of the beam to the pixel concerned which becomes one of the at least one pixel at the periphery with respect to another pixel defined for the position of the pixel concerned in the modulation rate map by a beam dose to the another pixel, and writing a pattern on a target object with the multi charged particle beams such that each beam of the corrected dose irradiates a corresponding pixel.

BRIEF DESCRIPTION OF THE DRAWINGS

FIGS. 7A and 7B show examples of modulation rate maps in each of which a modulation rate focusing on one pixel in the case of no correction is defined, as comparative examples of the first embodiment;

FIGS. 8A and 8B show examples of modulation rate maps in each of which a modulation rate focusing on one pixel is defined according to the first embodiment;

FIG. 9 shows an example of a part of a modulation rate map according to the first embodiment;

FIG. 11 shows an example of a corrected-dose map according to the first embodiment;

FIGS. 12A to 12C illustrate partial modulation maps and a method of modulating a dose according to a comparative example of the first embodiment;

DETAILED DESCRIPTION OF THE INVENTION

In the embodiments below, there will be described a multi charged particle beam writing apparatus and a method thereof that can correct positional deviation and dimension deviation of a pattern which is formed by irradiation of multi-beams including a beam with positional deviation.

In the embodiments below, there will be described a configuration in which an electron beam is used as an example of a charged particle beam. The charged particle beam is not limited to the electron beam, and other charged particle beams such as an ion beam may also be used.

First Embodiment

Figure 1:
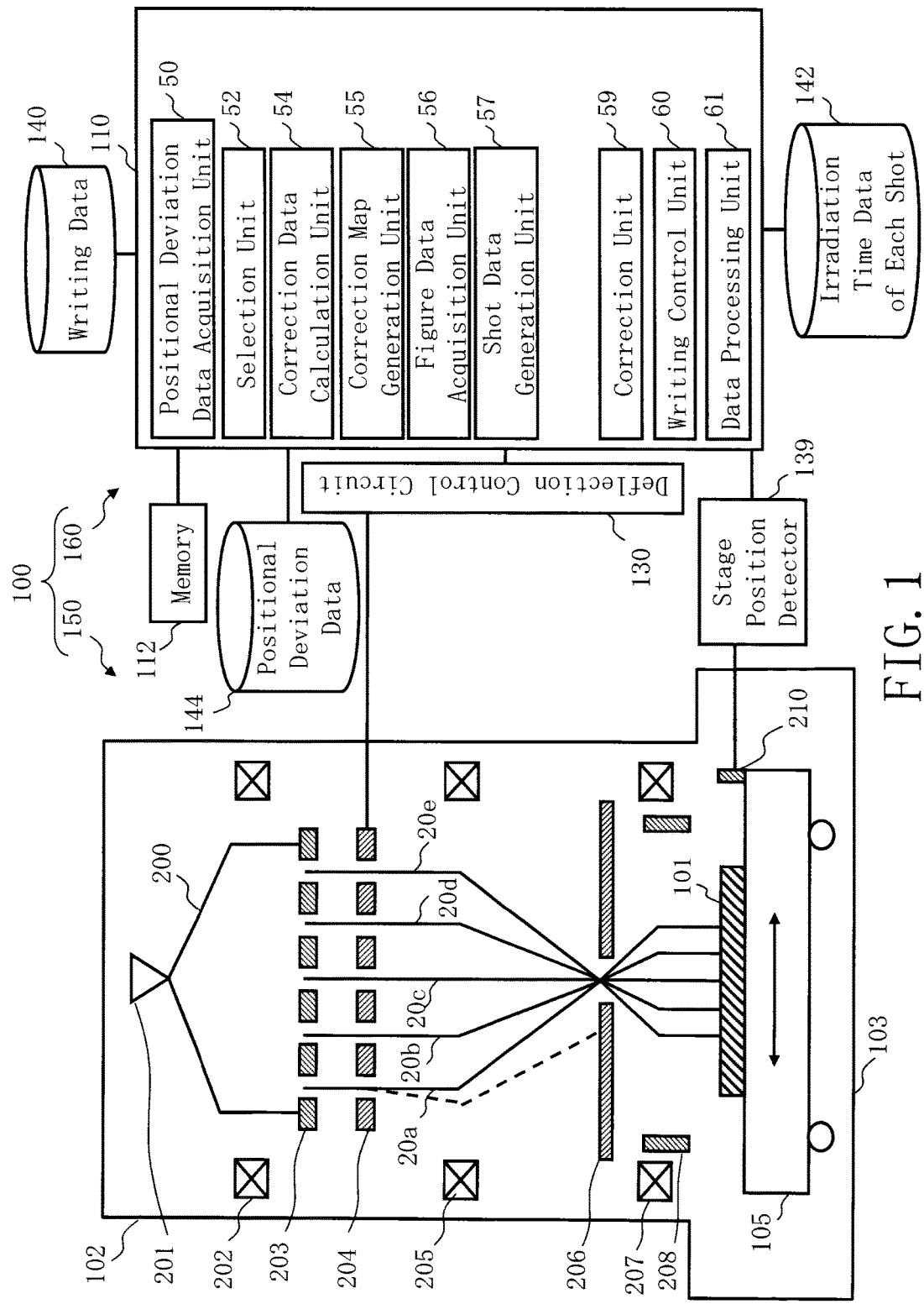
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing mechanism 150 and a control unit 160. The writing apparatus 100 is an example of a multi charged particle beam writing apparatus. The writing mechanism 150 includes an electron optical column 102 and a writing chamber 103. In the electron optical column 102, there are arranged an electron gun 201 (charged particle beam source), an illumination lens 202, an aperture member 203, a blanking plate 204, a reducing lens 205, a limiting aperture member 206, an objective lens 207, and a deflector 208. In the writing chamber 103, an XY stage 105 (stage) is arranged. On the XY stage 105, there is placed a target object or "sample" 101 such as a mask blank serving as a writing target substrate when writing is performed. For example, the target object 101 is an exposure mask used for manufacturing semiconductor devices, or is a semiconductor substrate (silicon wafer) on which semiconductor elements are formed. A mirror 210 for measuring the position of the XY stage 105 is arranged on the XY stage 105.

The control unit 160 includes a control computer 110, a memory 112, a deflection control circuit 130, a stage position detector 139, and storage devices 140, 142, and 144 such as magnetic disk drives. The control computer 110, the memory 112, the deflection control circuit 130, the stage position detector 139, and the storage devices 140, 142, and 144 are connected with each other through a bus (not shown). Writing data is input into the storage device 140 (storage unit) from the outside and stored therein.

In the control computer 110, there are arranged a positional deviation data acquisition unit 50, a selection unit 52, a correction data calculation unit 54, a correction map generation unit 55, a figure data acquisition unit 56, a shot data generation unit 57, a correction unit 59, a writing control unit 60, and a data processing unit 61. Each of "units" such as the positional deviation data acquisition unit 50, the selection unit 52, the correction data calculation unit 54, the correction map generation unit 55, the figure data acquisition unit 56, the shot data generation unit 57, the correction unit 59, the writing control unit 60, and the data processing unit 61 includes a processing circuitry. The processing circuitry includes an electric circuit, a quantum circuit, a computer, a processor, a circuit board, or a semiconductor device, for example. Each of the "units" may use the common processing circuitry (same processing circuitry), or may use different processing circuitries (separated processing circuitries). Data which is input and output to/from the positional deviation data acquisition unit 50, the selection unit 52, the correction data calculation unit 54, the correction map generation unit 55, the figure data acquisition unit 56, the shot data generation unit 57, the correction unit 59, the writing control unit 60, and the data processing unit 61, and data being operated are stored in the memory 112 each time.

FIG. 1 shows a configuration necessary for explaining the first embodiment. Other configuration elements generally necessary for the writing apparatus 100 may also be included.

Figure 2A:
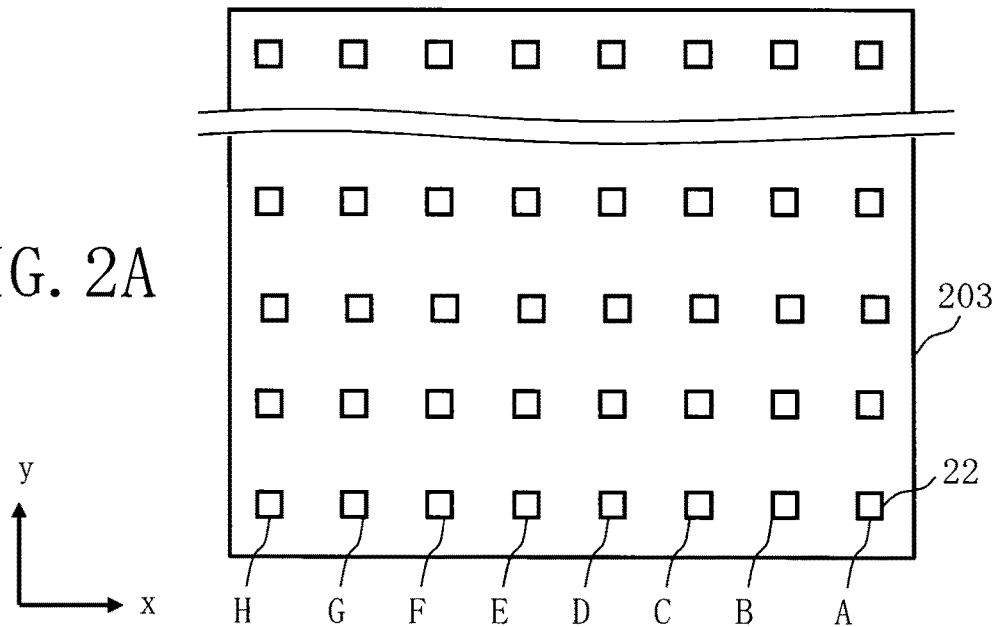
FIGS. 2A and 2B are conceptual diagrams each showing a configuration of an aperture member according to the first embodiment.
Figure 2B:
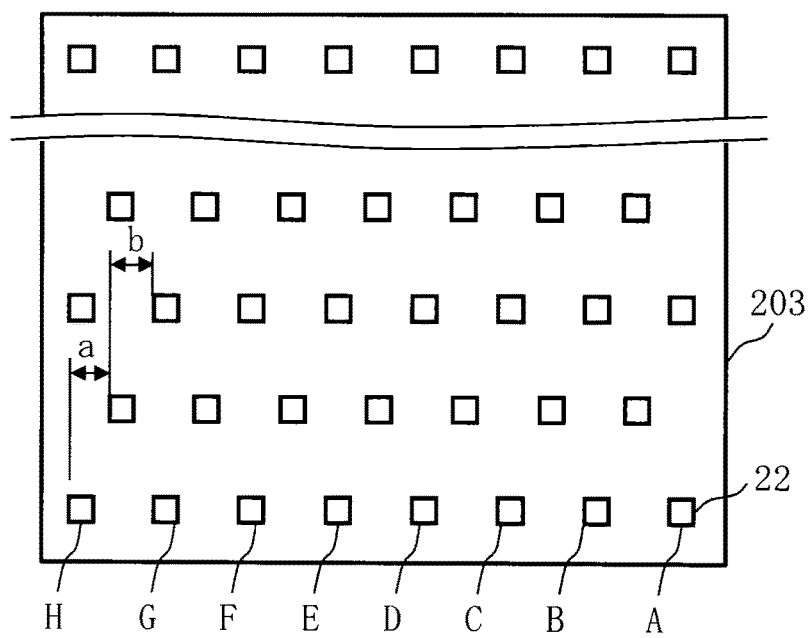

FIGS. 2A and 2B are conceptual diagrams each showing an example of the configuration of an aperture member according to the first embodiment. As shown in FIG. 2A, holes (openings) 22 of m rows long (y direction) and n columns wide (x direction) (m≥2, n≥2) are formed, like a matrix, at a predetermined arrangement pitch in the aperture member 203. In FIG. 2A, for example, holes 22 of 512 (rows)×8 (columns) are formed. Each of the holes 22 is a quadrangle of the same dimensional shape. Alternatively, each of the holes 22 can be a circle of the same circumference. Here, there is shown an example in which each of the rows arrayed in the y direction has eight holes 22 from A to H in the x direction. Multi-beams 20 are formed by letting portions of an electron beam 200 individually pass through a corresponding hole of a plurality of holes 22. The case in which the holes 22 of two or more rows and columns are arranged in both the x and the y directions is shown here, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. Moreover, the method of arranging the holes 22 is not limited to the case of FIG. 2A where holes are arranged like a grid in the length and width directions. For example, as shown in FIG. 2B, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

Figure 3:
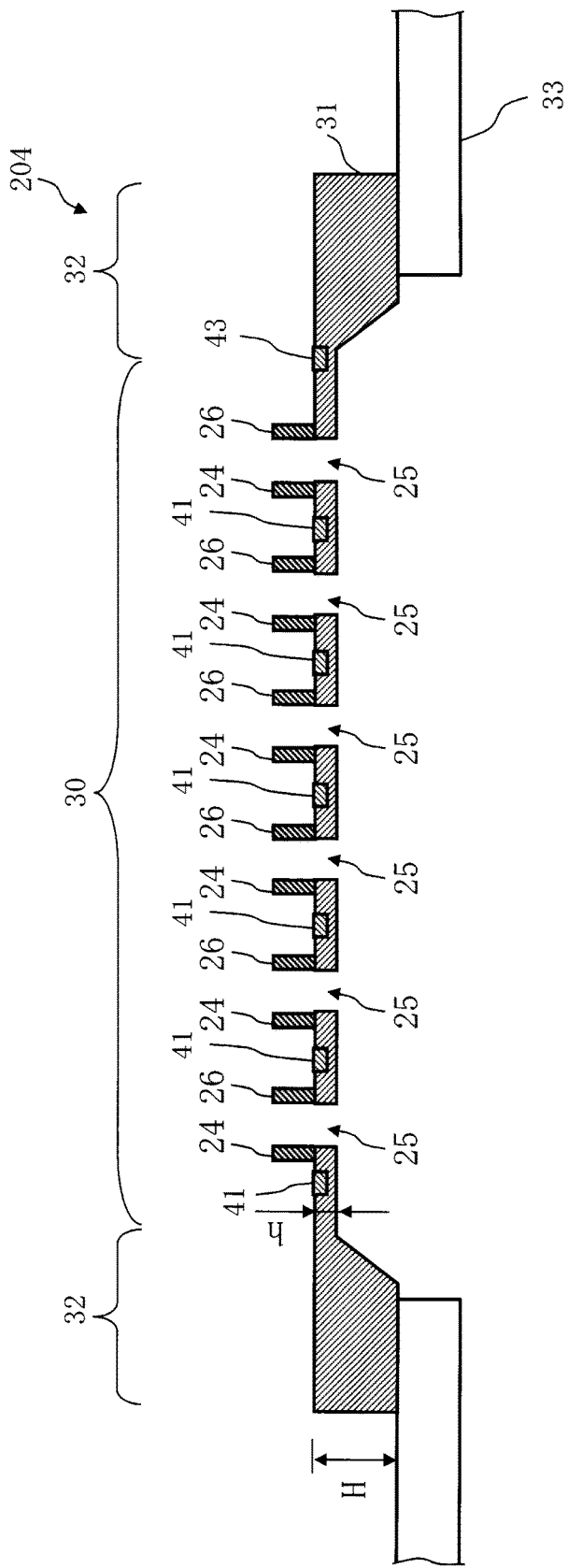
FIG. 3 is a sectional view showing a configuration of a blanking plate according to the first embodiment.
Figure 4:
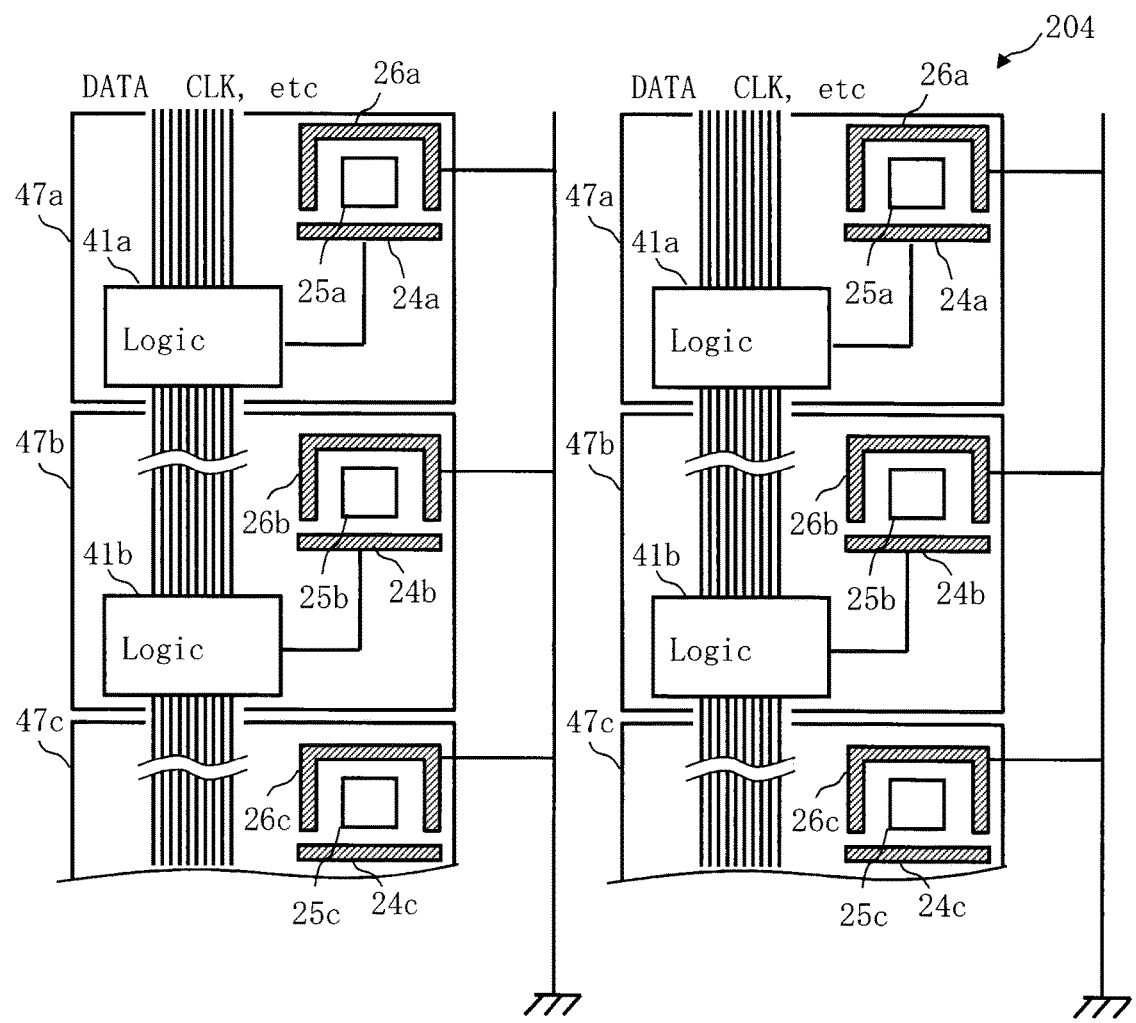
FIG. 4 is a top view conceptual diagram showing a part of a configuration in a membrane region of a blanking plate according to the first embodiment.

FIG. 3 is a sectional view showing a configuration of a blanking plate according to the first embodiment. FIG. 4 is a top view conceptual diagram showing a part of the configuration in a membrane region of a blanking plate according to the first embodiment. In FIGS. 3 and 4, the positional relation between a control electrode 24 and an counter electrode 26, and the positional relation between control circuits 41 and 43 are not in accordance with each other. With regard to the configuration of the blanking plate 204, as shown in FIG. 3, a semiconductor substrate 31 made of silicon, etc. is placed on a support table 33. The central part of the substrate 31 is shaved from the back side and processed to be a membrane region 30 (first region) having a thin film thickness h. The circumference surrounding the membrane region 30 is a circumference region 32 (second region) having a thick film thickness H. The upper surface of the membrane region 30 and the upper surface of the circumference region 32 are formed to be at the same height position, or substantially at the same height position. At the backside of the circumference region 32, the substrate 31 is supported to be on the support table 33. The central part of the support table 33 is open, and the position of the membrane region 30 is located in the opening part of the support table 33.

In the membrane region 30, there are formed passage holes 25 (openings) through which multi-beams individually pass at the positions each corresponding to each hole 22 of the aperture member 203 shown in FIG. 2A (or 2B). Then, as shown in FIGS. 3 and 4, pairs each composed of the control electrode 24 and the counter electrode 26 (blanker: blanking deflector) for blanking deflection are arranged on the membrane region 30, where each pair is close to a corresponding passage hole 25, and the control electrode 24 and the counter electrode 26 are at opposite sides of the corresponding passage hole 25. Moreover, close to each passage hole 25 in the membrane region 30, there is arranged the control circuit 41 (logic circuit) for applying a deflection voltage to the control electrode 24 for each passage hole 25. The counter electrode 26 for each beam is earthed (grounded).

Moreover, as shown in FIG. 4, for example, 10-bit parallel lines for control signals are connected to each control circuit 41. In addition to the 10-bit parallel lines for controlling, for example, clock signal lines and wiring lines for a power source are connected to each control circuit 41. A part of the parallel lines may be used as the clock signal lines and the power source wiring lines. An individual blanking mechanism 47 composed of the control electrode 24, the counter electrode 26, and the control circuit 41 is configured for each beam of the multi-beams. In the example of FIG. 3, the control electrode 24, the counter electrode 26, and the control circuit 41 are arranged in the membrane region 30 having a thin film thickness of the substrate 31. However, it is not limited thereto.

The electron beam 20 passing through a corresponding passage hole 25 is deflected by a voltage independently applied to the two electrodes 24 and 26 being a pair. Blanking control is performed by this deflection. In other words, each pair of the control electrode 24 and the counter electrode 26 blanking deflects a corresponding beam of multi-beams each having passed through a corresponding one of a plurality of holes 22 (openings) of the aperture member 203.

Operations of the writing mechanism 150 in the writing apparatus 100 will be described below. The electron beam 200 emitted from the electron gun 201 (emitter) almost perpendicularly (e.g., vertically) illuminates the whole of the aperture member 203 by the illumination lens 202. A plurality of holes (openings) each being a quadrangle are formed in the aperture member 203. The region including all the plurality of holes is irradiated by the electron beam 200. For example, a plurality of quadrangular electron beams (multi-beams) 20a to 20e are formed by letting portions of the electron beam 200 which irradiate the positions of a plurality of holes individually pass through a corresponding hole of the plurality of holes of the aperture member 203. The multi-beams 20a to 20e individually pass through a corresponding blanker (first deflector: individual blanking mechanism) of the blanking plate 204. Each blanker deflects (blanking deflects) the electron beam 20 which is individually passing.

The multi-beams 20a, 20b, . . . , 20e having passed through the blanking plate 204 are reduced by the reducing lens 205, and go toward the hole in the center of the limiting aperture member 206. At this stage, the electron beam 20 which was deflected by the blanker of the blanking plate 204 deviates from the hole in the center of the limiting aperture member 206 and is blocked by the limiting aperture member 206. On the other hand, the electron beam 20 which was not deflected by the blanker of the blanking plate 204 passes through the hole in the center of the limiting aperture member 206 as shown in FIG. 1. Blanking control is performed by ON/OFF of the individual blanking mechanism so as to control ON/OFF of beams. Thus, the limiting aperture member 206 blocks each beam which was deflected to be in a beam OFF state by the individual blanking mechanism. Then, one shot beam is formed by a beam which has been made during a period from becoming a beam ON state to becoming a beam OFF state and has passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 in order that respective beam irradiation positions on the target object 101 may be irradiated. While the XY stage 105 is continuously moving, controlling is performed by the deflector 208 so that irradiation positions of beams may follow (track) the movement of the XY stage 105, for example. The position of the XY stage 105 is measured by way of radiating a laser from the stage position detector 139 to the mirror 210 on the XY stage 105 and using its catoptric light. The multi-beams 20 irradiating at the same time are ideally aligned at pitches obtained by multiplying the arrangement pitch of a plurality of holes of the aperture member 203 by a desired reduction ratio described above. The writing apparatus 100 performs a writing operation by the raster scan method which continuously irradiates multi-beams 20, used as shot beams, per pixel in order by moving the beam deflection position by the deflector 208 while following the movement of the XY stage 105 during each tracking operation. When writing a desired pattern, a beam required according to a pattern is controlled to be ON by blanking control.

The writing region of the target object 101 or a chip region to be written is divided into strip-shaped stripe regions each having a predetermined width. Then, each stripe region is virtually divided into a plurality of mesh regions (pixels described above). Preferably, the size of the mesh region (pixel) is, for example, a beam size, or smaller than a beam size. For example, the size of the mesh region is preferably about 10 nm. The mesh region (pixel) serves as a unit region for irradiation per beam of multi-beams.

When writing the target object 101 with the multi-beams 20, as described above, irradiation is performed per pixel sequentially and continuously with multi-beams 20 being shot beams by moving the beam deflection position by the deflector 208 while following the movement of the XY stage 105 during the tracking operation. It is determined, based on the writing sequence, which beam of multi-beams irradiates which pixel on the target object 101. The region of the beam pitch (x direction) multiplied by the beam pitch (y direction), where the beam pitch is between beams adjoining in the x or y direction of multi-beams on the surface of the target object 101, is configured by a region (sub-pitch region) composed of n×n pixels. For example, when the XY stage 105 moves in the −x direction by the length of beam pitch (x direction) by one tracking operation, n pixels are written in the x or y direction (or diagonal direction) by one beam while the irradiation position is shifted. Then, by the next tracking operation, another n pixels in the same n×n pixel region are similarly written by a different beam from the one used above. Thus, n pixels are written each time of n times of tracking operations, using a different beam each time, thereby writing all the pixels in one region of n×n pixels. With respect also to other regions each composed of n×n pixels in the irradiation region of multi-beams, the same operation is performed at the same time to be written similarly.

Figure 5:
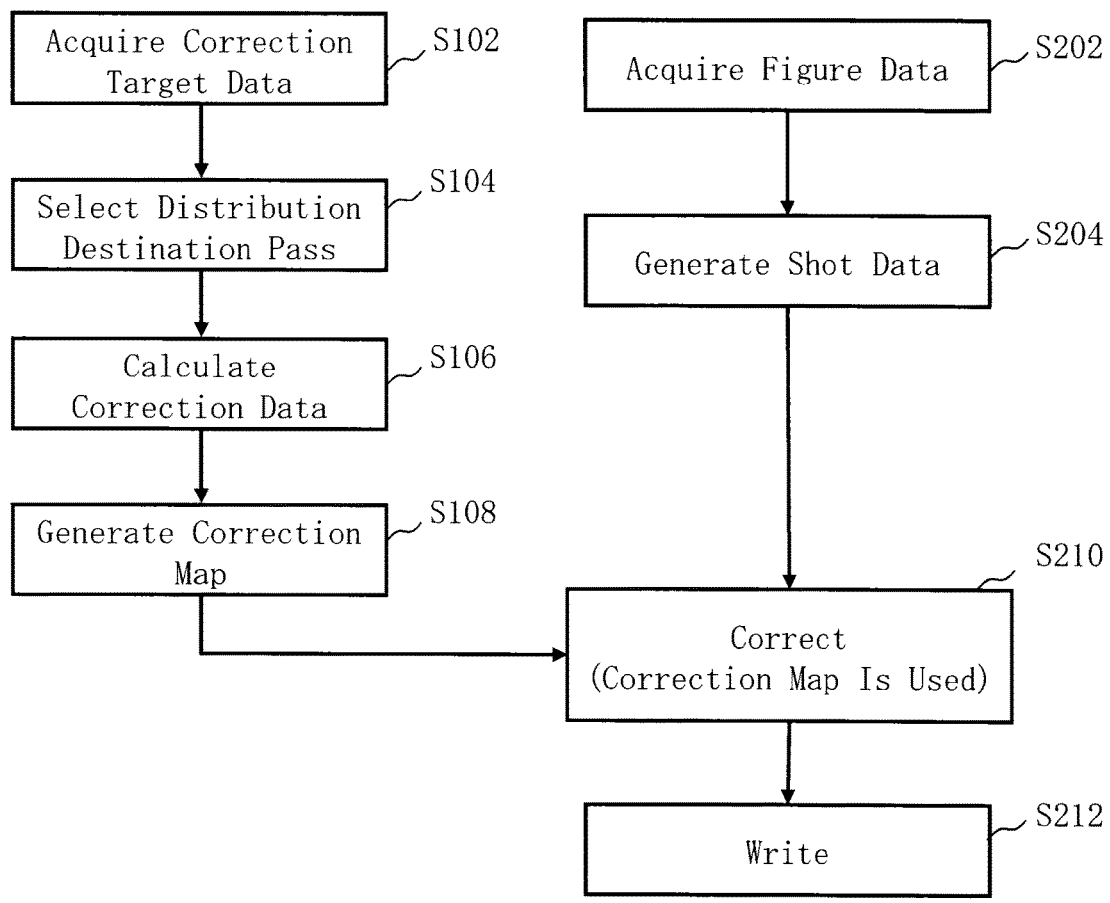
FIG. 5 is a flowchart showing main steps of a writing method according to the first embodiment.

FIG. 5 is a flowchart showing main steps of a writing method according to the first embodiment. As shown in FIG. 5, a series of a correction target data acquisition step (S102), a distribution destination pass selection step (S104), a correction data calculation step (S106), a correction map generation step (S108), a figure data acquisition step (S202), a shot data generation step (S204), a correction step (S210), and a writing step (S212) are executed. Steps from the correction target data acquisition step (S102) to the correction map generation step (S108) are preferably executed as pre-processing of the writing processing.

Before carrying out the writing processing, the positional deviation of the beam in each pixel, caused by irradiation of multi-beams on the surface of the target object 101, should be measured in advance. A substrate for measurement with applied resist, which is not shown, is placed on the stage 105 to be irradiated by multi-beams, and then, its irradiation position is measured. For example, along with the writing sequence, writing is performed pixel by pixel, or several pixels by several pixels, mutually separated to the extent causing no measurement problem, and then, the beam irradiation position of a pixel on the measurement substrate is measured using a position measurement device. If the difference between a design position and a measurement position can be obtained, the positional deviation amount for each pixel can be measured. This operation is repeated to measure beam positional deviation amounts of all the pixels. Obtained positional deviation data is input from the outside, and stored in the storage device 144.

In the correction target data acquisition step (S102), the positional deviation data acquisition unit 50 reads the positional deviation data stored in the storage device 144, and inputs (acquires) a positional deviation amount for each pixel.

In the distribution destination pass selection step (S104), the selection unit 52 selects, for each pixel, another pass (ordinal number of times of writing processing) in multiple writing, serving as a distribution destination to which a dose for correcting a positional deviation amount is distributed. In order to correct a positional deviation amount of a beam to a pixel, a part or all of the dose to a pixel of interest is divided and distributed to the other pixel(s) as to be described later. When performing multiple writing, the dose of a pixel of interest in one writing processing (pass) may be distributed to a pixel in another pass. Thus, according to the first embodiment, it is also preferable to perform distribution to at least one other pass in addition to perform distribution in the same pass.

In the correction data calculation step (S106), the correction data calculation unit 54 (modulation rate data calculation processing circuitry) calculates, for each pixel, a modulation rate of a beam to a pixel concerned and each modulation rate of a beam to at least one pixel at the periphery of the pixel of interest (that is, the pixel concerned), wherein these modulation rates are used for correcting positional deviation and dimension deviation (CD deviation) of a pattern formed by a beam with positional deviation to irradiate the pixel of interest by modulating a beam dose to the pixel of interest and a beam dose to the at least one pixel at the periphery of the pixel of interest.

Figures 6A, 6B:
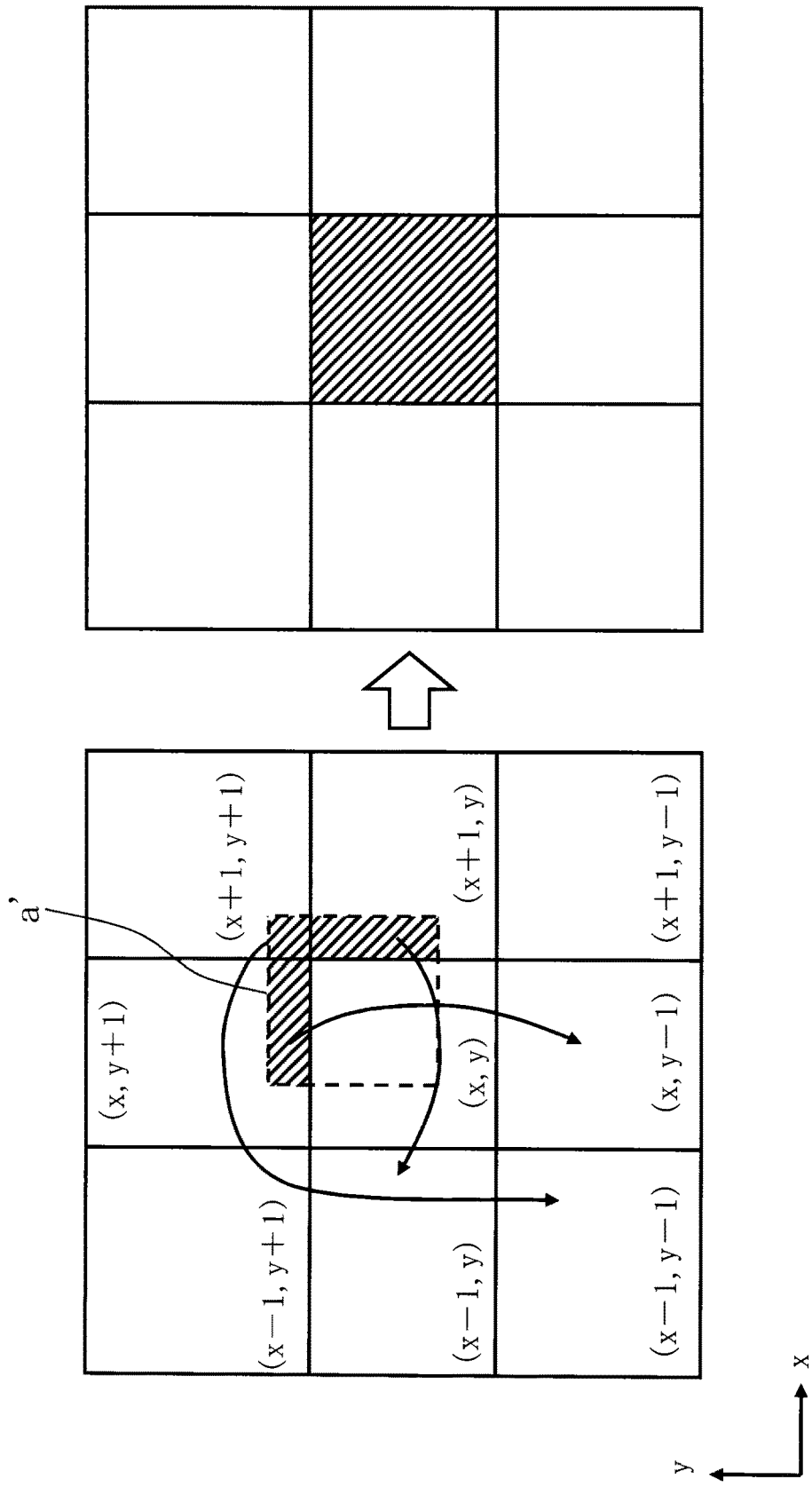
FIGS. 6A and 6B illustrate an example of a method of correcting a positional deviation according to the first embodiment.

FIGS. 6A and 6B illustrate an example of a method of correcting a positional deviation according to the first embodiment. FIG. 6A shows the case where a beam "a'" to irradiate the pixel of coordinates (x, y) deviates in the +x and +y directions. In order to correct the positional deviation of the pattern formed by the beam "a'" with positional deviation to the position of the pixel of coordinates (x, y) as shown in FIG. 6B, the correction can be accomplished by distributing the amount of dose deviation to a pixel located opposite to the direction of the deviated peripheral pixel. With respect to the example of FIGS. 6A and 6B, the amount of dose deviation which has shifted to the pixel of coordinates (x, y+1) should be distributed to the pixel of coordinates (x, y−1). The amount of dose deviation which has shifted to the pixel of coordinates (x+1, y) should be distributed to the pixel of coordinates (x−1, y). The amount of dose deviation which has shifted to the pixel of coordinates (x+1, y+1) should be distributed to the pixel of coordinates (x−1, y−1). Now, distribution methods (1) to (3) according to the first embodiment will be described below. Method (1): calculating a distribution amount (beam modulation rate) for distributing a dose to each beam for at least one peripheral pixel in proportion to a beam positional deviation amount. Method (2): calculating a distribution amount (beam modulation rate) for distributing a dose to each beam for at least one peripheral pixel by convergence calculation of a beam profile function. Method (3): calculating a distribution amount (beam modulation rate) for distributing a dose to each beam for at least one peripheral pixel and a pixel(s) of other writing pass(es) by convergence calculation of a function of a beam profile which is a system of beam profile functions for writing passes of multiple writing.

Method (1): this method is to calculate a distribution amount (beam modulation rate) for distributing a dose to a beam for at least one peripheral pixel in proportion to a beam positional deviation amount. The correction data calculation unit 54 calculates a modulation rate of a beam to a pixel of interest and a modulation rate of a beam to at least one pixel at the periphery of the pixel of interest according to the ratio of the area shifted due to a positional deviation of a beam to the pixel of interest. Specifically, for each peripheral pixel for which a part of a beam is overlapped because of beam deviation, the ratio obtained by dividing the area of a deviated portion (area of an overlapping beam portion) by the beam area is calculated as an amount of distribution (beam modulation rate) to a pixel located opposite to the overlapping pixel.

In the case of FIG. 6A, the area ratio of the portion displaced to the pixel of coordinates (x, y+1) can be calculated by ("beam size in x direction"−"deviation amount in x direction")×"deviation amount in y direction"/("beam size in x direction"×"beam size in y direction"). Therefore, a distribution amount (beam modulation rate) A to be distributed for correction to the pixel of coordinates (x, y−1) can be calculated by ("beam size in x direction"−"deviation amount in x direction")×"deviation amount in y direction"/("beam size in x direction"×"beam size in y direction").

Also, in the case of FIG. 6A, the area ratio of the portion displaced to the pixel of coordinates (x+1, y+1) can be calculated by "deviation amount in x direction"×"deviation amount in y direction"/("beam size in x direction"×"beam size in y direction"). Therefore, a distribution amount (beam modulation rate) B to be distributed for correction to the pixel of coordinates (x−1, y−1) can be calculated by "deviation amount in x direction"×"deviation amount in y direction"/("beam size in x direction"×"beam size in y direction").

Also, in the case of FIG. 6A, the area ratio of the portion displaced to the pixel of coordinates (x+1, y) can be calculated by "deviation amount in x direction"×("beam size in y direction"−"deviation amount in y direction")/("beam size in x direction"×"beam size in y direction"). Therefore, a distribution amount (beam modulation rate) C to be distributed for correction to the pixel of coordinates (x−1, y) can be calculated by "deviation amount in x direction"×("beam size in y direction"−"deviation amount in y direction")/("beam size in x direction"×"beam size in y direction").

As a result, a modulation rate D of the beam of the pixel of coordinates (x, y), which remains without being distributed, can be calculated by 1−A−B−C.

Method (2): this method is to calculate a distribution amount (beam modulation rate) for distributing a dose to a beam for at least one peripheral pixel by convergence calculation of a beam profile function. The correction data calculation unit 54 calculates an unknown dose Di(x) to irradiate a pixel of interest and an unknown dose Di(x) to irradiate at least one pixel at the periphery of the pixel of interest so that a first beam profile function and a second beam profile function may accord with each other, where the first beam profile function is a beam profile function without distribution using an unknown dose Da(x) to irradiate the pixel of interest without distributing a dose to a pixel at the periphery of the pixel of interest, and the second beam profile function is a beam profile function with distribution using an unknown dose Di(x) to irradiate the pixel of interest and an unknown dose Di(x) to irradiate a pixel at the periphery of the pixel of interest so that a dose may be divided and distributed to the pixel at the periphery of the pixel of interest. Here, "i" is an index that indicates positions of pixels including the pixel of interest and peripheral pixels. The unknown dose Di(x) can be obtained by the following equation (1) by performing convergence calculation, using a distribution function g(x). In the equation (1), the position x indicates a vector, and xdis indicates a position relevant to a beam considering a positional deviation. The peripheral pixel i being a distribution destination is set for each pixel, based on positional deviation data. Specifically, a pixel located opposite to a pixel where beams are overlapped due to position deviation should be targeted.

$$\int D_a(x')g(x-x')dx' = \sum_i \int D_i(x'_{dis})g(x-x'_{dis})dx'_{dis} \quad (1)$$

By solving the equation (1), it is possible to obtain the dose of the pixel of interest and the dose of a peripheral pixel being a distribution destination when performing dose division and distribution. If the dose Di has been defined by the ratio to a prescribed value, a calculated Di value can be obtained as a modulation rate of a beam.

Method (3): this method is to calculate a distribution amount (beam modulation rate) for distributing a dose to each beam for at least one peripheral pixel and a pixel(s) of other writing pass(es) by convergence calculation of a function of a beam profile which is a system of beam profile functions for writing passes of multiple writing. When calculating an unknown dose Di(x) to irradiate the pixel of interest and each unknown dose Di(x) to irradiate at least one pixel at the periphery of the pixel of interest in a predetermined pass (ordinal number of times of writing) in multiple writing, the correction data calculation unit 54 calculates, in addition to the contents of the method (2), each unknown dose Di to be distributed to at least one pixel of the pixel of interest and a pixel (s) at the periphery of the pixel of interest in another pass different from the predetermined pass. Here, "i" is an index that indicates positions of pixels including the pixel of interest and the peripheral pixel (s) in the target pass and other pass(es). The unknown dose Di(x) can be obtained by the following equation (2) by performing convergence calculation, using a pass number "pass" and a distribution function g(x). In the equation (2), the position x indicates a vector, and xdis indicates a position relevant to a beam considering a positional deviation. The peripheral pixel i being a distribution destination is set for each pixel, based on positional deviation data. Specifically, a pixel located opposite to a pixel where beams are overlapped due to position deviation should be targeted. Moreover, regarding a pixel used as a distribution destination in another writing pass, an arbitrary pixel should be selected from at least one pixel located at an opposite side of the pixel of interest against a pixel with which a beam to the pixel of interest overlaps due to position deviation, in an arbitrarily selected other writing pass.

$$\int D_a(x')g(x-x')dx' = \sum_{pass}\sum_i \int D_i(x'_{dis})g(x-x'_{dis})dx'_{dis} \quad (2)$$

By solving the equation (2), the dose of the pixel of interest and the dose of a peripheral pixel being a distribution destination when dose division and distribution is performed, and the dose of the pixel of interest being a distribution destination and the dose of a peripheral pixel being a distribution destination in a selected writing pass can be obtained. If the dose Di has been defined by the ratio to a prescribed value, a calculated Di value can be obtained as a modulation rate of a beam.

As described above, for each pixel, the modulation rate of a beam to the pixel concerned and each modulation rate of a beam to at least one peripheral pixel being a distribution destination are calculated.

In the correction map generation step (S108), the correction map generation unit 55 (modulation rate map generation processing circuitry) generates, for each pixel, a modulation rate map (correction map) which defines a modulation rate for a writing region to be written by multi-beams such that a calculated modulation rate of the beam to the pixel concerned is defined for the position of the pixel concerned, and each calculated modulation rate of the beam to the at least one pixel at the periphery of the pixel of interest (that is, the pixel concerned), being a distribution destination, is defined for the position of a corresponding pixel of the at least one peripheral pixel, being a distribution destination, in such a manner to be related to the pixel of interest.

FIGS. 7A and 7B show examples of modulation rate maps in each of which a modulation rate focusing on one pixel in the case of no correction is defined, as comparative examples of the first embodiment. In FIG. 7A, the pixel in the third column from the left in the third row from the top is focused. In FIG. 7B, the pixel in the third column from the left in the fourth row from the top is focused. When not correcting the dose of a beam due to positional deviation, both the modulation rates of beams of the pixels of interest in FIGS. 7A and 7B are "1".

FIGS. 8A and 8B show examples of modulation rate maps in each of which a modulation rate focusing on one pixel is defined according to the first embodiment. In FIG. 8A, the pixel in third column from the left in the third row from the top is focused. In FIG. 8B, the pixel in third column from the left in the fourth row from the top is focused. In the case where a beam to the pixel of interest in the third column from the left in the third row from the top shown in FIG. 7A deviates in +x and +y directions, for example, within the range of the beam size, in the first embodiment similarly to the description on FIG. 6A, the beam dose to the pixel of interest is divided and distributed to the peripheral pixel in the second column from the left in the third row from the top, the peripheral pixel in the second column from the left in the fourth row from the top, and the peripheral pixel in the third column from the left in the fourth row from the top as shown in FIG. 8A. In the example of FIG. 8A, for example, the beam modulation rate of the distribution dose (distribution ratio) to the peripheral pixel in the second column from the left in the third row from the top is 0.15, that to the peripheral pixel in the second column from the left in the fourth row from the top is 0.07, and that to the peripheral pixel in the third column from the left in the fourth row from the top is 0.14. As the result, the modulation rate of the beam to the pixel of interest is 0.64.

In the case where a beam to the pixel of interest in the third column from the left in the fourth row from the top shown in FIG. 7B deviates in +x and +y directions, for example, within the range of the beam size, in the first embodiment similarly to the description on FIG. 6A, the beam dose to the pixel of interest is divided and distributed to the peripheral pixel in the second column from the left in the fourth row from the top, the peripheral pixel in the second column from the left in the fifth row from the top, and the peripheral pixel in the third column from the left in the fifth row from the top as shown in FIG. 8B. In the example of FIG. 8B, for example, the beam modulation rate of the distribution dose (distribution ratio) to the peripheral pixel in the second column from the left in the fourth row from the top is 0.08, that to the peripheral pixel in the second column from the left in the fifth row from the top is 0.05, and that to the peripheral pixel in the third column from the left in the fifth row from the top is 0.14. As the result, the modulation rate of the beam to the pixel of interest is 0.73.

Figure 9:
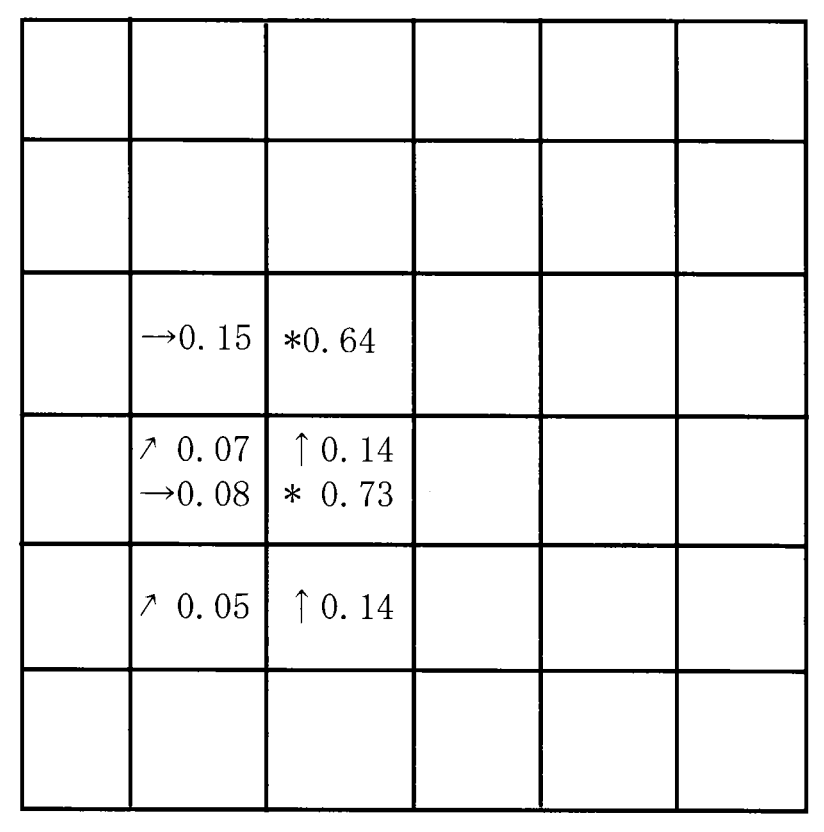

FIG. 9 shows an example of a part of a modulation rate map according to the first embodiment. For each pixel, the modulation rate map according to the first embodiment defines a calculated modulation rate of a beam to the pixel concerned for the position of the pixel concerned, and defines each calculated modulation rate of a beam to at least one pixel at the periphery of the pixel of interest (that is, the pixel concerned), being a distribution destination, for the position of a corresponding pixel of the at least one peripheral pixel, being a distribution destination, in such a manner to be related to the pixel of interest.

In the example of FIG. 9, with respect to the pixel in the second column from left in the third row from the top, as a peripheral pixel of the pixel of interest in the third column from the left in the third row from the top which is located in the direction of the arrow, the modulation rate 0.15 that has been divided and distributed related to the pixel of interest is defined. In FIG. 9, a modulation rate in the case of the pixel in the second column from left in the third row from the top being a pixel of interest is not shown for description convenience.

Moreover, with respect to the pixel in the second column from left in the fourth row from the top, as a peripheral pixel of the pixel of interest in the third column from the left in the third row from the top, which is located in the direction of the arrow, the modulation rate 0.07 that has been divided and distributed related to the pixel of interest is defined. Further, as a peripheral pixel of the pixel of interest in the third column from the left in the fourth row from the top, which is located in the direction of the arrow, the modulation rate 0.08 that has been divided and distributed related to the pixel of interest is defined for the pixel in the second column from left in the fourth row from the top. In FIG. 9, the modulation rate in the case of the pixel in the second column from left in the fourth row from the top being a pixel of interest is not shown for description convenience.

With respect to the pixel in the second column from left in the fifth row from the top, as a peripheral pixel of the pixel of interest in the third column from the left in the fourth row from the top which is located in the direction of the arrow, the modulation rate 0.05 that has been divided and distributed related to the pixel of interest is defined. In FIG. 9, a modulation rate in the case of the pixel in the second column from left in the fifth row from the top being a pixel of interest is not shown for description convenience.

With respect to the pixel in the third column from the left in the third row from the top, the modulation rate 0.64 with the asterisk * is defined as the modulation rate of the pixel of interest itself. In FIG. 9, modulation rates in the case of pixels other than the pixel in the third column from left in the third row from the top being pixels of interest are not shown for description convenience.

With respect to the pixel in the third column from the left in the fourth row from the top, the modulation rate 0.73 with the asterisk * is defined as the modulation rate of the pixel of interest itself. Further, as a peripheral pixel of the pixel of interest in the third column from the left in the third row from the top, which is located in the direction of the arrow, the modulation rate 0.14 that has been divided and distributed related to the pixel of interest is defined for the pixel in the third column from left in the fourth row from the top.

With respect to the pixel in the third column from left in the fifth row from the top, as a peripheral pixel of the pixel of interest in the third column from the left in the fourth row from the top which is located in the direction of the arrow, the modulation rate 0.14 that has been divided and distributed related to the pixel of interest is defined. In FIG. 9, a modulation rate in the case of the pixel in the third column from left in the fifth row from the top being a pixel of interest is not shown for description convenience.

Although information on all the pixels is defined in one modulation rate map in the examples described above, it is not limited thereto. For example, it is also preferable to generate, for each pixel, a modulation rate map where information on the pixel concerned and related peripheral pixels is defined.

The generated modulation rate map (correction map) is stored in the storage device 144. As described above, a modulation rate map is generated as preprocessing, and then, actual writing processing is started.

First, the writing region of the target object 101 or a chip region to be written is divided into strip-shaped stripe regions each having a predetermined width, by the shot data generation unit 57 or the data processing unit 61. Then, each stripe region is virtually divided into a plurality of pixels (mesh regions) described above.

In the figure data acquisition step (S202), the figure data acquisition unit 56 reads and acquires writing data (figure data) from the storage device 140. The figure data acquisition unit 56 reads corresponding writing data from the storage device 140 for each stripe region, for example.

In the shot data generation step (S204), the shot data generation unit 57 inputs writing data, and calculates the area density of a pattern arranged in each pixel or each group of a plurality of pixels. For example, the shot data generation unit 57 assigns a plurality of figure patterns defined in the writing data to a corresponding pixel. Then, the area density of a figure pattern arranged in each pixel or each group of a plurality of pixels is calculated.

The shot data generation unit 57 (dose calculation processing circuitry) calculates, for each pixel, a beam dose to the pixel concerned. Here, a dose (which hereinafter will also be referred to as "irradiation time T", "shot time period", or "exposure time") of an electron beam per shot is calculated for each pixel. When performing multiple writing, the dose of the electron beam per shot in each hierarchy (or "each writing process") of the multiple writing is calculated. It is preferable to obtain a reference dose (or irradiation time T) to be in proportion to the area density of a calculated pattern. Moreover, it is preferable that the dose to be finally calculated in the shot data generation step (S204) is a dose after correction, that is a dose having been corrected with respect to a dimension variation amount generated due to a phenomenon (not shown) causing dimension variations, such as a proximity effect, a fogging effect, and a loading effect. The size of a plurality of pixels for defining a dose and the size of a plurality of mesh regions where the area density of a pattern is defined may be the same size or different sizes. When they are different sizes, each dose is calculated after interpolating an area density by linear interpolation, etc. The irradiation time can be defined by a value obtained by dividing a dose D by a current density J.

Figure 10:
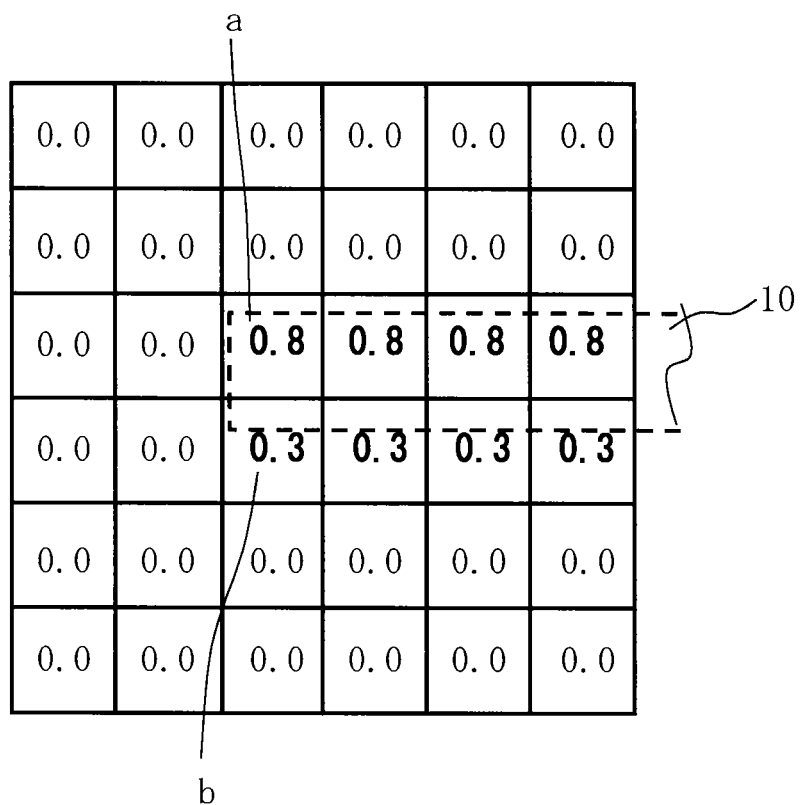
FIG. 10 shows an example of a dose map according to the first embodiment.

FIG. 10 shows an example of a dose map according to the first embodiment. As shown in FIG. 10, the dose is defined for each pixel in the dose map. The dose in FIG. 10 is shown as the ratio to a reference dose Dbase which has been set in advance. FIG. 10 shows the case of defining the dose of each pixel in the layout where a figure pattern 10 is arranged in the writing region of the target object 101. The pixel "a" in FIG. 10 indicates the pixels of interest shown in FIGS. 7A and 8A, and the pixel "b" indicates the pixels of interest shown in FIGS. 7B and 8B.

In the correction step (S210), the correction unit 59 (corrected-dose calculation processing circuitry) calculates, for each pixel, a corrected dose (or correction irradiation time) by adding a multiplied value obtained by multiplying a modulation rate of a beam to the pixel concerned defined in the modulation rate map by a beam dose to the pixel concerned, and a multiplied value obtained by multiplying a modulation rate of a beam to the pixel concerned which becomes one of the at least one pixel at the periphery with respect to another pixel defined for the position of the pixel concerned in the modulation rate map, by a beam dose to the another pixel.

FIG. 11 shows an example of a corrected-dose map according to the first embodiment. FIG. 11 illustrates the pixels "a" and "b" of interest shown in FIG. 10 and their related pixels. In the case of FIG. 11, doses of pixels in the fourth and subsequent columns from the left, and distribution of doses of pixels in the fourth and subsequent columns from the left are not shown for description convenience.

In FIG. 11, the pixel in the second column from the left in the third row from the top is a peripheral pixel of the pixel "a" of interest in the third column from the left in the third row from the top, whose relation is the one shown by the arrow in FIG. 9. Therefore, the dose distributed from the pixel "a" of interest is 0.12 obtained by multiplying the dose 0.8 of the pixel "a" of interest by the distributed modulation rate 0.15. Thus, the corrected dose of the pixel in the second column from the left in the third row from the top is 0.12.

The pixel in the second column from the left in the fourth row from the top is a peripheral pixel of the pixel "a" of interest in the third column from the left in the third row from the top, and also a peripheral pixel of the pixel "b" of interest in the third column from the left in the fourth row from the top, whose relation is the one shown by the arrow in FIG. 9. Therefore, the dose distributed from the pixel "a" of interest is 0.056 obtained by multiplying the dose 0.8 of the pixel "a" of interest by the distributed modulation rate 0.07. Moreover, the dose distributed from the pixel "b" of interest is 0.024 obtained by multiplying the dose 0.3 of the pixel "b" of interest by the distributed modulation rate 0.08. Thus, the corrected dose of the pixel in the second column from the left in the fourth row from the top is 0.08 (=0.56+ 0.024) being a sum value.

The pixel in the second column from the left in the fifth row from the top is a peripheral pixel of the pixel "b" of interest in the third column from the left in the fourth row from the top, whose relation is the one shown by the arrow in FIG. 9. Therefore, the dose distributed from the pixel "b" of interest is 0.015 obtained by multiplying the dose 0.3 of the pixel "b" of interest by the distributed modulation rate 0.05. Thus, the corrected dose of the pixel in the second column from the left in the fifth row from the top is 0.015.

The pixel in the third column from the left in the third row from the top is the pixel "a" of interest itself, as shown with the asterisk * in FIG. 9. Therefore, the remaining dose obtained by subtracting the distributed dose from the pixel "a" of interest is 0.512 which is calculated by multiplying the dose 0.8 of the pixel "a" of interest by the modulation rate 0.64. Thus, the corrected dose of the pixel in the third column from the left in the third row from the top is 0.512.

The pixel in the third column from the left in the fourth row from the top is the pixel "b" of interest itself, as shown with the asterisk * in FIG. 9, and also a peripheral pixel of the pixel "a" of interest in the third column from the left in the third row from the top, which is shown by the arrow. Therefore, the remaining dose obtained by subtracting the distributed dose from the pixel "b" of interest is 0.219 which is calculated by multiplying the dose 0.3 of the pixel "b" of interest by the modulation rate 0.73. Moreover, the dose distributed from the pixel "a" of interest is 0.112 obtained by multiplying the dose 0.8 of the pixel "a" of interest by the distributed modulation rate 0.14. Thus, the corrected dose of the pixel in the third column from the left in the fourth row from the top is 0.331 (=0.219+0.112) being a sum value.

The pixel in the third column from the left in the fifth row from the top is a peripheral pixel of the pixel "b" of interest in the third column from the left in the fourth row from the top, whose relation is the one shown by the arrow in FIG. 9. Therefore, the dose distributed from the pixel "b" of interest is 0.042 obtained by multiplying the dose 0.3 of the pixel "b" of interest by the distributed modulation rate 0.14. Thus, the corrected dose of the pixel in the third column from the left in the fifth row from the top is 0.042.

The corrected dose (irradiation time T) for each pixel is defined in a corrected-dose map (irradiation time map), and the corrected-dose map (irradiation time map) is stored in the storage device 142, for example.

Figures 12A, 12B, 12C:
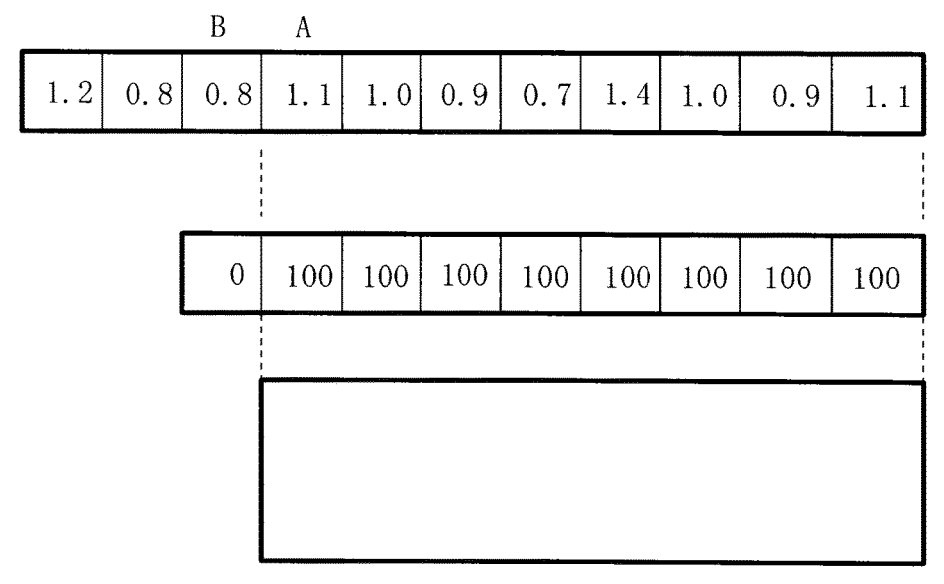

FIGS. 12A to 12C illustrate partial modulation maps and a method of modulating a dose according to a comparative example of the first embodiment. FIG. 12A shows a part of a modulation map in which modulation rates are simply and uniquely defined. Here, if a writing target figure is arranged in the position shown in FIG. 12C, the dose is 100% in the pixels in each of which the writing target figure is arranged, whereas, the dose is 0% in the pixel in which no writing target figure is arranged as shown in FIG. 12B. With respect to the dose of the pixel A at the left end of the writing target figure, it is insufficient to perform correction using only the modulation rate of the pixel A shown in FIG. 12A, and therefore, it is necessary to perform correction using the adjacent pixel B. However, in the modulation map shown in FIG. 12A, the dose of the pixel B after modulation is zero. On the other hand, according to the first embodiment as shown in FIG. 9, since the distributed doses of pixels at the periphery of the pixel of interest are defined related to the pixel of interest, even when the dose of the pixel B before modulation is zero, it is possible to make the dose of the pixel B after modulation be a finite value. This can be proved by the fact that the doses of pixels in the second column from the left in the third to fifth rows from the top are finite values in FIG. 11.

In the writing step (S212), the writing mechanism 150 writes a pattern on the target object 101 with multi-beams such that each corresponding pixel is irradiated with a beam of a corrected dose. First, the data processing unit 61 converts the corrected dose to an irradiation time, and then, rearranges the shot order to be along the sequence of writing. Then, the rearranged irradiation time arrangement data is output to the deflection control circuit 130.

The deflection control circuit 130 outputs, for each shot, irradiation time arrangement data to each control circuit 41. Then, under the control of the writing control unit 60, the writing mechanism 150 performs writing based on an irradiation time concerned, for each shot of each beam. Operations of the writing mechanism 150 have already been described above.

Figure 13:
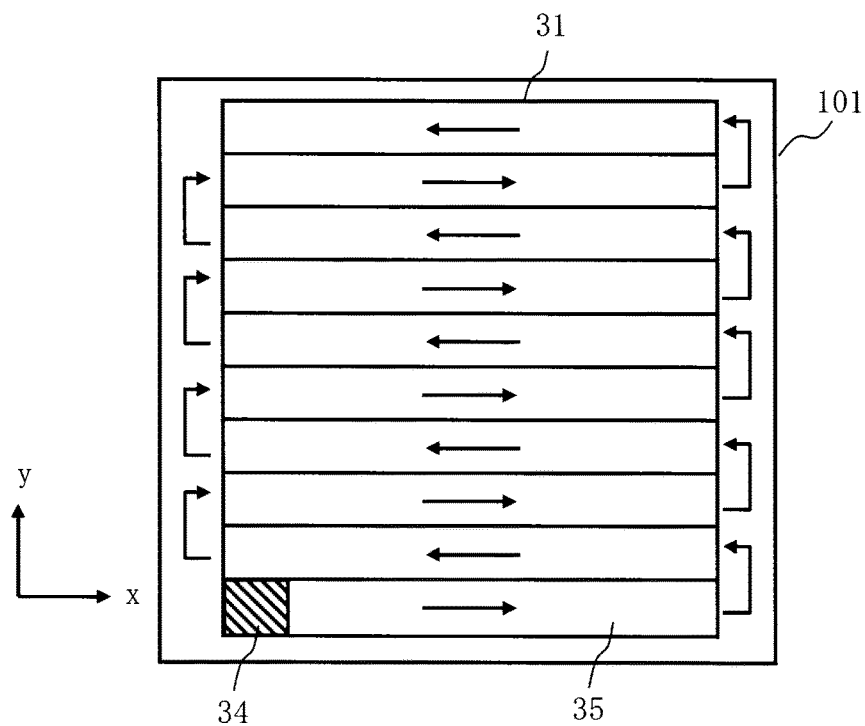
FIG. 13 is a conceptual diagram illustrating an example of a writing operation according to the first embodiment.

FIG. 13 is a conceptual diagram illustrating an example of a writing operation according to the first embodiment. As shown in FIG. 13, a writing region 31 of the target object 101 is virtually divided into a plurality of strip-shaped stripe regions 35 each having a predetermined width in the y direction, for example. Each of the stripe regions 35 serves as a unit region for writing. The XY stage 105 is moved to make an adjustment such that an irradiation region 34 which can be irradiated by one irradiation of the multi-beams 20 is located at the left end of the first stripe region 35 or at a position more left than the left end, and then writing is started. When writing the first stripe region 35, the writing advances relatively in the x direction by moving the XY stage 105 in the −x direction, for example. The XY stage 105 is continuously moved at a predetermined speed, for example. After writing the first stripe region 35, the stage position is moved in the −y direction to make an adjustment such that the irradiation region 34 is located at the right end of the second stripe region 35 or at a position more right than the right end to be relatively located in the y direction. Then, similarly, writing advances in the −x direction by moving the XY stage 105 in the x direction, for example. That is, writing is performed while alternately changing the direction, such as performing writing in the x direction in the third stripe region 35, and in the −x direction in the fourth stripe region 35, and thus, the writing time can be reduced. However, the writing operation is not limited to the case of performing writing while alternately changing the direction, and it is also acceptable to perform writing in the same direction when writing each stripe region 35. By one shot, a plurality of shot patterns of the same number, at the maximum, as the number of the holes 22 are formed at a time by multi-beams which have been formed by passing through respective corresponding holes 22 of the aperture member 203.

Simulation of distributing a dose by each method described above is performed. Simulation on positional deviation, critical dimension (CD) deviation, and likelihood (DL) of a written pattern in the case of writing an evaluation pattern of 80 nm (x direction size)×200 nm (y direction size) with multi-beams has been executed. Here, the beam size is set to be 10 nm, the spread of the beam is to be 20 nm, and the maximum value of the beam position change is set to be 5 nm. Their results are described below with reference to the methods (1) and (3).

Figure 14:
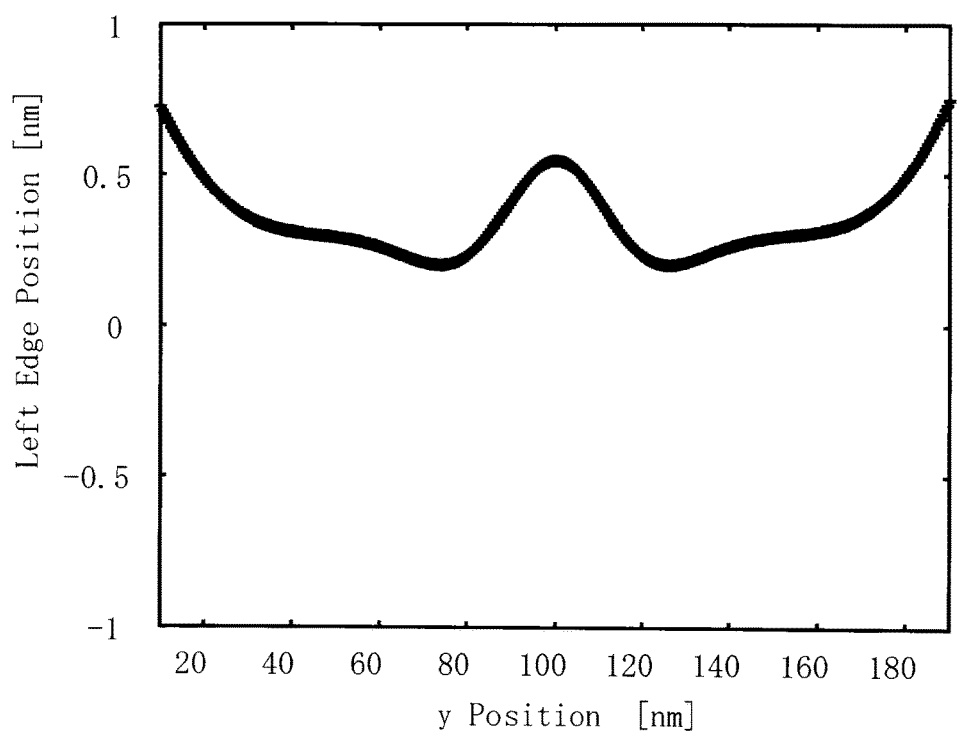
FIG. 14 shows an example of a simulation result in the case of distributing a dose by the method (1) of the first embodiment.

FIG. 14 shows an example of a simulation result in the case of distributing a dose by the method (1) of the first embodiment. According to the method (1), a dose is distributed to a beam for at least one peripheral pixel to be in proportion to a beam positional deviation amount. FIG. 14 shows a positional deviation amount at the x direction end (left end) of an evaluation pattern with respect to the design position along the y direction. Although the deviation distortion once becomes larger at the central part in the y direction as shown in FIG. 14, compared with the case of no correction, the positional deviation amount can be reduced.

Figure 15:
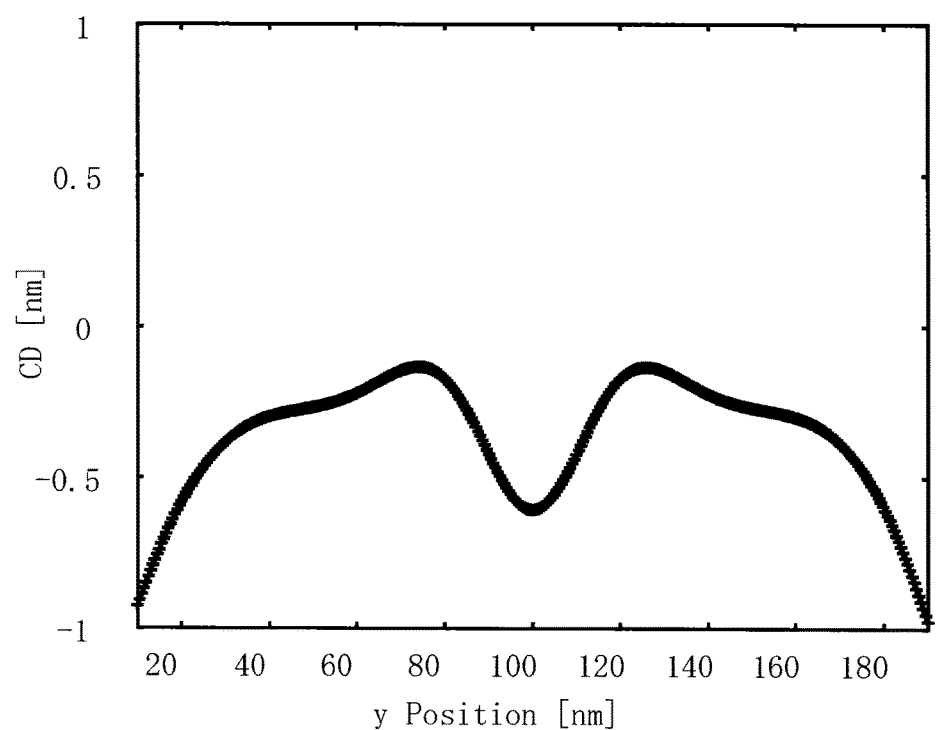
FIG. 15 shows another example of a simulation result in the case of distributing a dose by the method (1) of the first embodiment.

FIG. 15 shows another example of a simulation result in the case of distributing a dose by the method (1) of the first embodiment. FIG. 15 shows a CD deviation amount of the width (CD) in the x direction of an evaluation pattern with respect to the design position along the y direction. Although the deviation distortion once becomes larger at the central part in the y direction as shown in FIG. 15, compared with the case of no correction, the CD deviation amount can be reduced.

Figure 16:
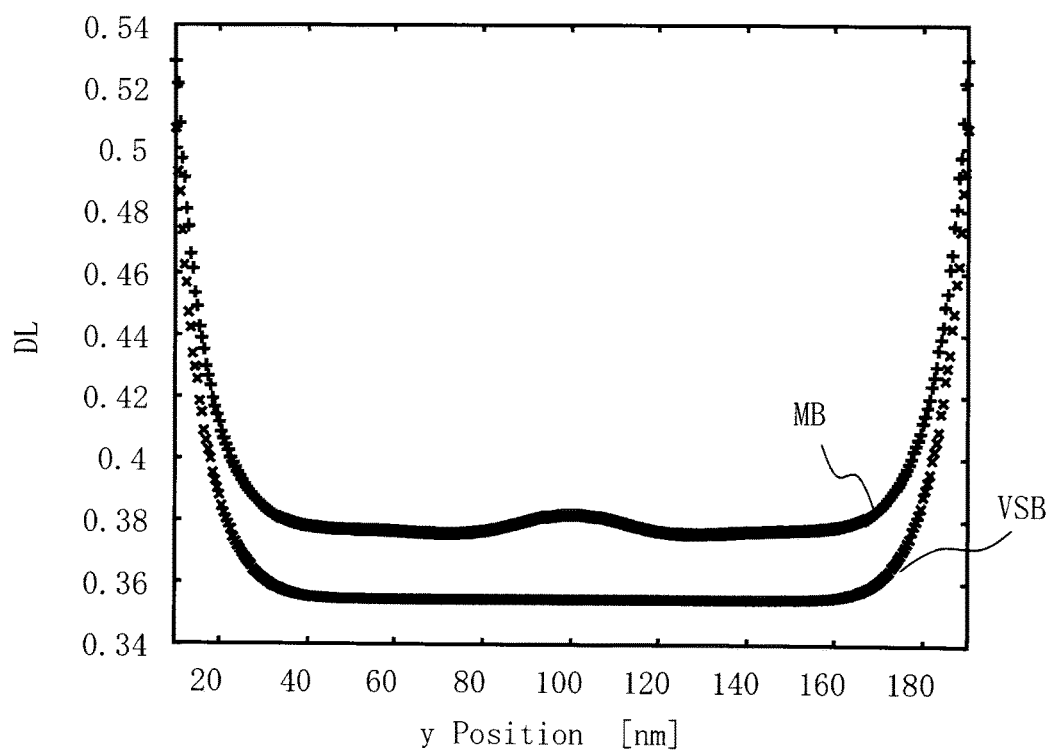
FIG. 16 shows another example of a simulation result in the case of distributing a dose by the method (1) of the first embodiment.

FIG. 16 shows another example of a simulation result in the case of distributing a dose by the method (1) of the first embodiment. FIG. 16 shows likelihood (DL) in the x direction of an evaluation pattern with respect to the design position along the y direction. FIG. 16 also shows, as a comparative example, the case of writing with a variable-shaped beam (VSB) writing apparatus using a single beam. Although it falls short of VSB as shown in FIG. 16, the likelihood can be improved to the value close to that of VSB.

Figure 17:
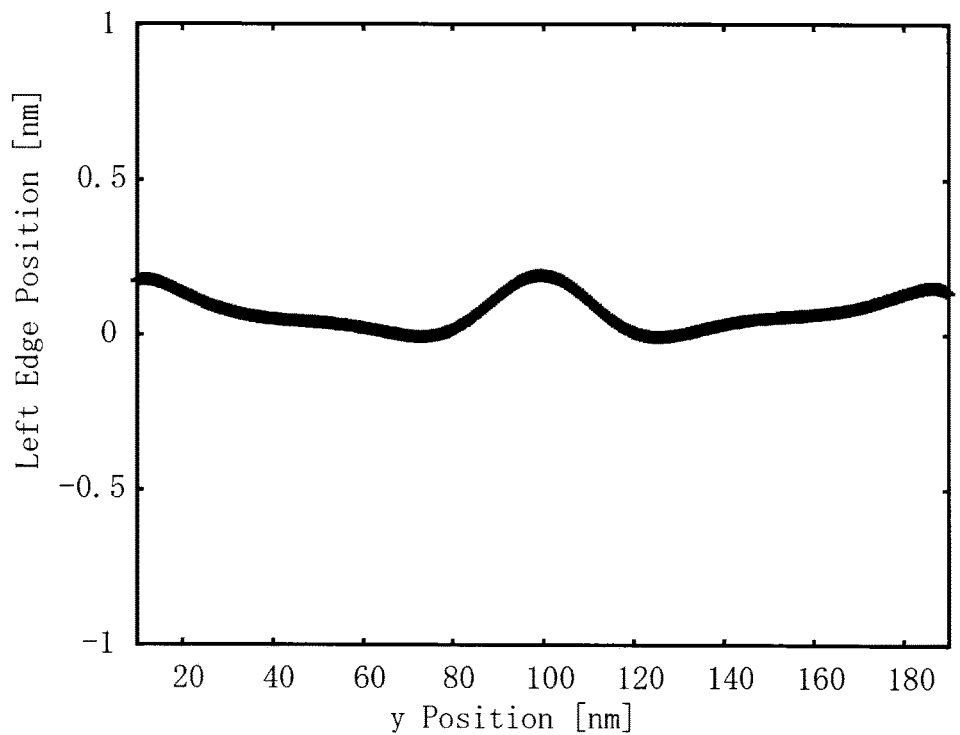
FIG. 17 shows an example of a simulation result in the case of distributing a dose by the method (3) of the first embodiment.

FIG. 17 shows an example of a simulation result in the case of distributing a dose by the method (3) of the first embodiment. According to the method (3), a dose is distributed to a beam for at least one peripheral pixel and a pixel(s) of other writing pass(es) by convergence calculation of a function of a beam profile which is a system of beam profile functions for writing passes of multiple writing. FIG. 17 shows a positional deviation amount at the x direction end (left end) of an evaluation pattern with respect to the design position along the y direction. Although the deviation distortion once becomes larger at the central part in the y direction as shown in FIG. 17, compared with the method of (1) shown in FIG. 15, the positional deviation amount can be further reduced.

Figure 18:
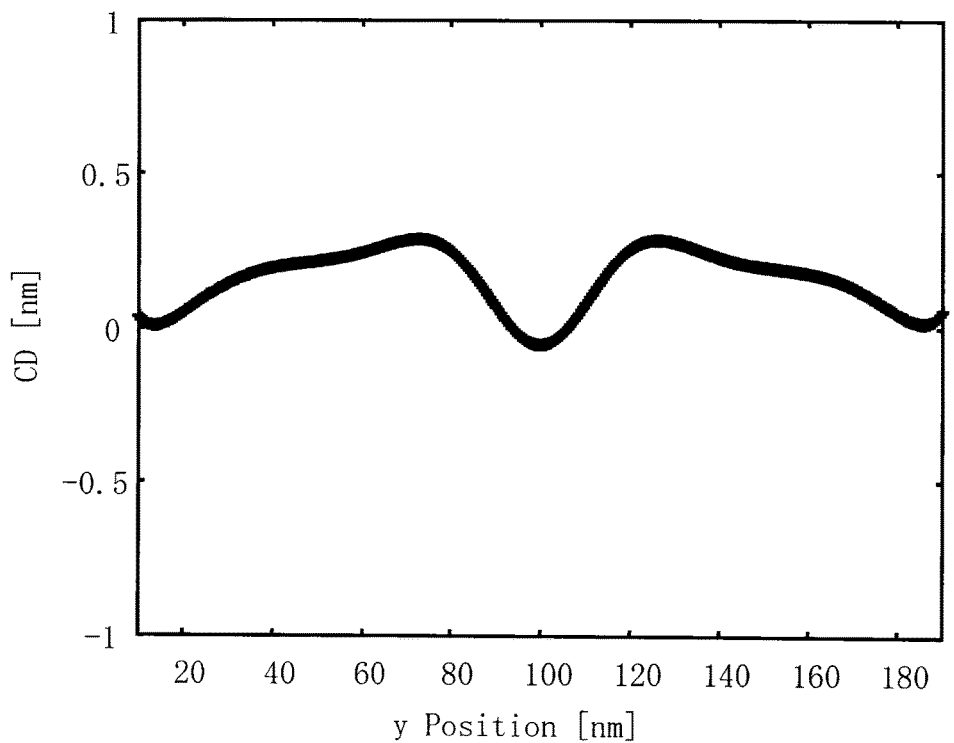
FIG. 18 shows another example of a simulation result in the case of distributing a dose by the method (3) of the first embodiment.

FIG. 18 shows another example of a simulation result in the case of distributing a dose by the method (3) of the first embodiment. FIG. 18 shows a CD deviation amount of the width (CD) in the x direction of an evaluation pattern with respect to the design position along the y direction. Although the deviation distortion once becomes larger at the central part in the y direction as shown in FIG. 18, compared with the method of (1) shown in FIG. 15, the CD deviation amount can be further reduced.

Figure 19:
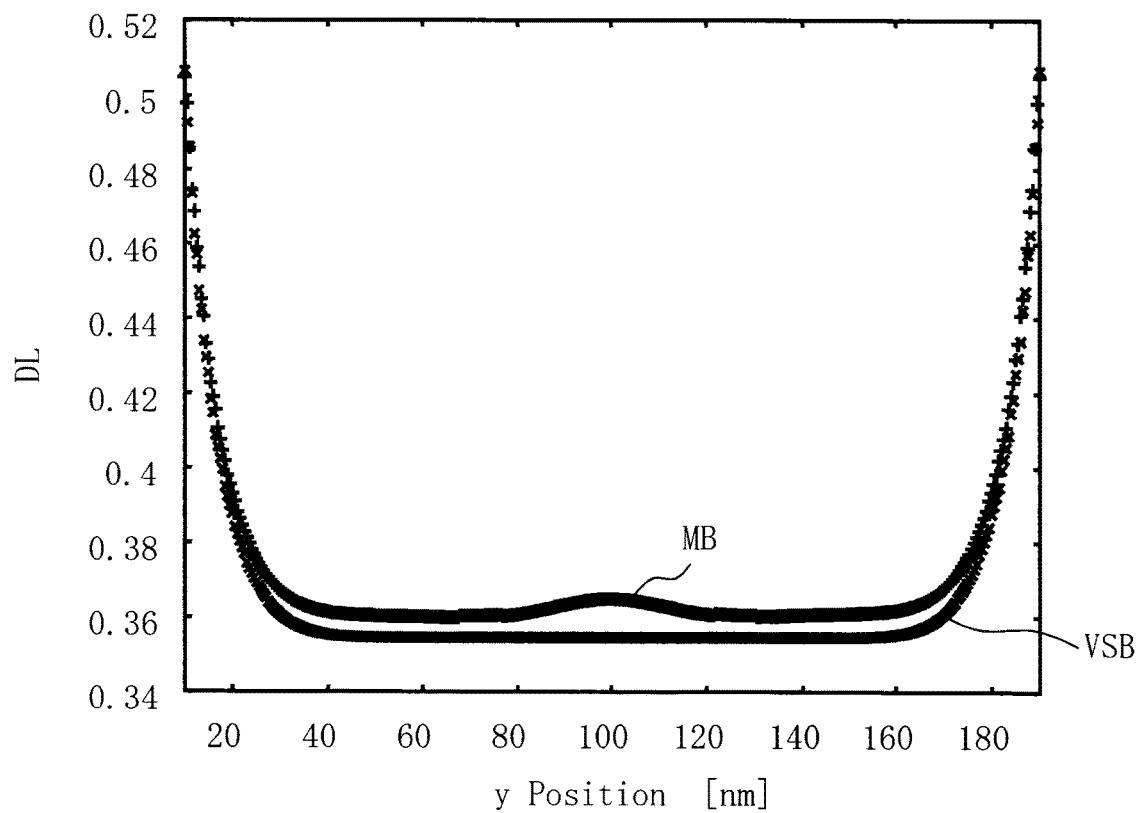
FIG. 19 shows another example of a simulation result in the case of distributing a dose by the method (3) of the first embodiment.

FIG. 19 shows another example of a simulation result in the case of distributing a dose by the method (3) of the first embodiment. FIG. 19 shows likelihood (DL) in the x direction of an evaluation pattern with respect to the design position along the y direction. FIG. 19 also shows, as a comparative example, the case of writing with a variable-shaped beam (VSB) writing apparatus using a single beam. Although it falls short of VSB as shown in FIG. 19, compared with the method of (1) shown in FIG. 16, the likelihood can be improved to the value further close to that of VSB.

As described above, according to the first embodiment, in addition to a dose (irradiation time) map (bitmap), a modulation rate map where a modulation rate after distribution is defined for each pixel and a modulation rate indicating a relation to a distributing party is defined for a peripheral pixel is generated, and this modulation rate map is combined with the dose (irradiation time) map in order to acquire a highly accurate corrected dose. In particular, at the pattern end, it is possible to obtain a dose of a peripheral pixel where no pattern is arranged. Moreover, since the modulation rate is calculated based on a system of beam profile functions for a plurality of writing passes of multiple writing, when performing multiple writing while changing a beam to irradiate the same pixel, a beam having good characteristics can be used positively, and, from also this point of view, the writing precision can be improved. Furthermore, the writing precision can be improved by performing a convergence calculation using a threshold value model.

As described above, according to the first embodiment, it is possible to correct positional deviation and dimension deviation of a pattern which is formed by irradiation of multi-beams including a beam with positional deviation. In particular, its effect can be notably achieved at a pattern end. Therefore, highly precise writing can be performed.

Embodiments have been explained referring to concrete examples described above. However, the present invention is not limited to these specific examples. Although, in the above examples, the case of generating a correction map which uses a pixel as a unit of the element of the map for the whole of the writing region 31 or the stripe region 35, for example, it is not limited thereto. For example, it is also preferable to generate a correction map which uses a pixel as a unit of the element of the map for pixels for the irradiation region 34 that can be irradiated by multi-beams at a time. In such a case, if the correction map for the irradiation region 34 is once generated, the map can be used at each of the writing positions. Therefore, the time and the resource for correction map generation processing can be reduced.

While the case of inputting a 10-bit control signal into each control circuit 41 has been described above, the number of bits may be suitably set. For example, a 2-bit (or 3 to 9 bit) control signal may be used. Alternatively, a control signal of 11-bit or more may be used.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other multi charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
    a modulation rate data calculation processing circuitry configured to calculate, for each pixel being irradiated by a beam of multi charged particle beams, a modulation rate of the beam to the respective pixel and a corresponding modulation rate of the beam to at least one pixel at a periphery of the respective pixel based on a positional deviation amount for each pixel by distributing at least a portion of a dose to the respective pixel to the at least one pixel at the periphery of the respective pixel in accordance with the positional deviation amount of the beam to irradiate the respective pixel;
    a modulation rate map generation processing circuitry configured to generate, for each pixel, a modulation rate map which defines the calculated modulation rate of the beam to the respective pixel associated with a position of the respective pixel and defines each calculated modulation rate of the beam to the at least one pixel at the periphery of the respective pixel in association with a corresponding position of the at least one pixel at the periphery of the respective pixel;
    a dose calculation processing circuitry configured to calculate, for each pixel, a beam dose to the respective pixel;
    a corrected-dose calculation processing circuitry configured to calculate, for each pixel, a corrected dose by adding a first value obtained by multiplying the modulation rate of the beam to the respective pixel defined in the modulation rate map by the beam dose to the respective pixel, and a second value obtained by multiplying the modulation rate of the beam to the respective pixel which is one of the at least one pixel at the periphery with respect to another pixel defined in the modulation rate map by a beam dose to the another pixel; and
    a writing mechanism including a stage on which a target object is placed, a charged particle beam source, and a deflector, and configured to write a pattern on the target object with the multi charged particle beams by irradiating each pixel by a beam of the corrected dose corresponding to the respective pixel.

2. The apparatus according to claim 1, wherein the modulation rate data calculation processing circuitry calculates the modulation rate to irradiate the respective pixel and each modulation rate to irradiate the at least one pixel at the periphery of the respective pixel such that a first beam profile function and a second beam profile function accord with each other, where the first beam profile function uses the modulation rate to irradiate the respective pixel without distributing the dose to a pixel at the periphery of the respective pixel, and the second beam profile function uses the modulation rate to irradiate the respective pixel and each modulation rate to irradiate the at least one pixel at the periphery of the respective pixel such that the dose is divided and distributed to the at least one pixel at the periphery of the respective pixel.

3. The apparatus according to claim 1, wherein the modulation rate data calculation processing circuitry calculates the modulation rate of the beam to the respective pixel and each modulation rate of the beam to the at least one pixel at the periphery of the respective pixel according to a ratio of an area shifted due to positional deviation of a beam to the respective pixel.

4. The apparatus according to claim 2, wherein, in a case of calculating the modulation rate to irradiate the respective pixel and each modulation rate to irradiate the at least one pixel at the periphery of the respective pixel in a predetermined pass in multiple writing, the modulation rate data calculation processing circuitry further calculates another modulation rate to be distributed to at least one pixel of the respective pixel and pixels at the periphery of the respective pixel, in another pass different from the predetermined pass.

5. The apparatus according to claim 4, further comprising:
    a positional deviation data acquisition processing circuitry configured to acquire a positional deviation amount for each pixel.

6. The apparatus according to claim 4, further comprising:
    a selection processing circuitry configured to select, for each pixel, another pass in the multiple writing serving as a distribution destination to which a dose for correcting positional deviation is distributed.

7. A multi charged particle beam writing method comprising:
    calculating, for each pixel being irradiated by a beam of multi charged particle beams, a modulation rate of the beam to the respective pixel and a corresponding modulation rate of the beam to at least one pixel at a periphery of the respective pixel pixel concerned by modulating a beam dose to the pixel concerned and each beam dose to the based on a positional deviation amount for each pixel by distributing at least a portion of a dose to the respective pixel is distributed to the at least one pixel at the periphery of the respective pixel in accordance with the positional deviation amount of the beam to irradiate the respective pixel;
    generating, for each pixel, a modulation rate map which defines the calculated modulation rate of the beam to the respective pixel associated with a position of the respective pixel and defines each calculated modulation rate of the beam to the at least one pixel at the periphery of the respective pixel in association with a corresponding position of the at least one pixel at the periphery of the respective pixel;
    calculating, for each pixel, the beam dose to the respective pixel;
    calculating, for each pixel, a corrected dose by adding a first value obtained by multiplying the modulation rate of the beam to the respective pixel defined in the modulation rate map by the beam dose to the respective pixel, and a second value obtained by multiplying the modulation rate of the beam to the respective pixel which becomes one of the at least one pixel at the periphery with respect to another pixel defined in the modulation rate map by a beam dose to the another pixel; and
    writing a pattern on a target object with the multi charged particle beams by irradiating each pixel by a beam of the corrected dose corresponding to the respective pixel.

8. The method according to claim 7, wherein the modulation rate to irradiate the respective pixel and each modulation rate to irradiate the at least one pixel at the periphery of the respective pixel are calculated such that a first beam profile function and a second beam profile function accord with each other, where the first beam profile function uses the modulation rate to irradiate the respective pixel without distributing a dose to a pixel at the periphery of the respective pixel, and the second beam profile function uses the modulation rate to irradiate the respective pixel and each modulation rate to irradiate the at least one pixel at the periphery of the respective pixel such that the dose is divided and distributed to the at least one pixel at the periphery of the respective pixel.

9. The method according to claim 7, wherein the modulation rate of the beam to the respective pixel and each modulation rate of the beam to the at least one pixel at the periphery of the respective pixel are calculated according to a ratio of an area shifted due to positional deviation of the beam to the respective pixel.

10. The method according to claim 8, wherein, in a case of calculating the modulation rate to irradiate the respective pixel and the modulation rate to irradiate the at least one pixel at the periphery of the respective pixel in a predetermined pass in multiple writing, another modulation rate to be distributed to at least one pixel of the respective pixel and pixels at the periphery of the respective pixel, in another pass different from the predetermined pass is further calculated.

11. The apparatus according to claim 1, wherein the modulation rate data calculation processing circuitry distributes at least a portion of the dose to the respective pixel to a pixel at the periphery located in a direction from the respective pixel that is opposite to a direction of the positional deviation amount of the beam.

12. The method according to claim 7, wherein the calculating the modulation rate includes distributing at least a portion of the dose to the respective pixel to a pixel at the periphery located in a direction from the respective pixel that is opposite to a direction of the positional deviation amount of the beam.

* * * * *